(12) United States Patent
Cho et al.

(10) Patent No.: US 11,875,746 B2
(45) Date of Patent: Jan. 16, 2024

(54) DISPLAY APPARATUS

(71) Applicant: Samsung Display Co., Ltd., Yongin-Si (KR)

(72) Inventors: Youngjin Cho, Yongin-si (KR); Joongsoo Moon, Yongin-si (KR); Minwoo Byun, Yongin-si (KR); Yangwan Kim, Yongin-si (KR); Changkyu Jin, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 16/932,660

(22) Filed: Jul. 17, 2020

(65) Prior Publication Data

US 2020/0349891 A1 Nov. 5, 2020

Related U.S. Application Data

(63) Continuation of application No. 16/407,135, filed on May 8, 2019, now Pat. No. 10,726,789.

(30) Foreign Application Priority Data

Jul. 9, 2018 (KR) .......................... 10-2018-0079571

(51) Int. Cl.
*G09G 3/3258* (2016.01)

(52) U.S. Cl.
CPC ... *G09G 3/3258* (2013.01); *G09G 2300/0426* (2013.01); *G09G 2300/0452* (2013.01);
(Continued)

(58) Field of Classification Search
CPC ............ H01L 2227/323; H01L 27/3262; H01L 27/3276; H01L 2227/326; H01L 27/3265;
(Continued)

(56) References Cited

U.S. PATENT DOCUMENTS 7,626,199 B2   12/2009  Kim
9,431,472 B2   8/2016   Lee et al.
(Continued)

FOREIGN PATENT DOCUMENTS

EP    3309844 A1    4/2018
KR    10-0823199 B1 4/2008
(Continued)

OTHER PUBLICATIONS

Partial European Search Report, Application No. 19184857.1, dated Nov. 28, 2019, 22 pages.

*Primary Examiner* — Michael A Faragalla
(74) *Attorney, Agent, or Firm* — Innovation Counsel LLP

(57) ABSTRACT

A display apparatus with improved light emission uniformity includes a pixel. The pixel includes a driving thin-film transistor (TFT); a storage capacitor; a driving semiconductor layer; a first electrode layer; a second electrode layer; a pixel electrode; a pixel-defining layer defining a light-emitting region; and a conductive layer interposed between the first electrode layer and the pixel electrode and including an extending portion that at least partially overlaps the light-emitting region in a plane view to pass over a central portion of the light-emitting region.

14 Claims, 21 Drawing Sheets

(52) U.S. Cl.
CPC ........... *G09G 2300/0809* (2013.01); *G09G 2320/0233* (2013.01); *G09G 2320/0242* (2013.01)

(58) Field of Classification Search
CPC ........ H01L 27/3272; G09G 2300/0809; G09G 2320/0233; G09G 3/3258; G09G 2320/0238; G09G 2300/0819; G09G 2300/0452; G09G 2320/0242; G09G 3/3233; G09G 2300/0842; G09G 2300/0426; G09G 2300/0861; G09G 2320/0214
See application file for complete search history.

(56) References Cited

U.S. PATENT DOCUMENTS

| | | | |
|---|---|---|---|
| 9,466,652 | B2 | 10/2016 | Kim |
| 9,893,136 | B2 | 2/2018 | Byun et al. |
| 9,911,763 | B2 | 3/2018 | Seo et al. |
| 10,062,743 | B2 | 8/2018 | Lee et al. |
| 10,304,920 | B2 | 5/2019 | Choi et al. |
| 2011/0114957 | A1* | 5/2011 | Kim .................. H01L 29/78633 257/59 |
| 2016/0013210 | A1* | 1/2016 | Li ........................ H01L 27/124 438/23 |
| 2016/0300864 | A1 | 10/2016 | Seo et al. |
| 2017/0025487 | A1 | 1/2017 | Byun et al. |
| 2017/0153740 | A1* | 6/2017 | Xu ........................ G02F 1/1368 |
| 2017/0207287 | A1* | 7/2017 | Matsunaga ......... H01L 27/3258 |
| 2017/0323598 | A1 | 11/2017 | Park et al. |
| 2017/0330927 | A1 | 11/2017 | Lee et al. |
| 2018/0053480 | A1 | 2/2018 | Lim et al. |
| 2018/0061869 | A1* | 3/2018 | Suzuki .............. G02F 1/134309 |
| 2018/0062102 | A1 | 3/2018 | Kim |
| 2018/0102400 | A1 | 4/2018 | Choi et al. |
| 2018/0374955 | A1* | 12/2018 | Yoshida ............ G02F 1/134363 |

FOREIGN PATENT DOCUMENTS

| | | |
|---|---|---|
| KR | 10-2014-0120734 A | 10/2014 |
| KR | 10-2016-0022438 A | 3/2016 |
| KR | 10-2016-0121651 A | 10/2016 |
| KR | 10-2017-0012767 A | 2/2017 |
| KR | 10-2017-0125160 A | 11/2017 |
| KR | 10-2017-0127602 A | 11/2017 |
| KR | 10-2018-0025431 A | 3/2018 |
| KR | 10-2018-0040185 A | 4/2018 |

* cited by examiner

DISPLAY APPARATUS

CROSS-REFERENCE TO RELATED APPLICATION(S)

This is a continuation application of U.S. patent application Ser. No. 16/407,135 filed on May 8, 2019, which claims the benefit of Korean Patent Application No. 10-2018-0079571, filed on Jul. 9, 2018, in the Korean Intellectual Property Office, the disclosures of which are incorporated herein in their entirety by reference.

BACKGROUND

1. Field

One or more embodiments of the present disclosure relate to a display apparatus, and more particularly, to a display apparatus with improved light emission uniformity.

2. Description of the Related Art

In general, a display apparatus includes a display device and various circuit elements for controlling electrical signals applied to the display device. Examples of such circuit elements include a thin film transistor (TFT), a storage capacitor, and a plurality of wirings.

To accurately control light emission of a display device and a degree of light emission, the number of TFTs electrically connected to the display device and the number of wirings for transmitting electrical signals to the TFTs have increased.

SUMMARY

In a display apparatus of a small size or having a high-resolution according to the related art, spacings between elements and/or wirings of thin-film transistors (TFTs) included in the display apparatus are reduced, and thus, there arises a problem with deteriorated light emission uniformity due to the increasing parasitic capacitance of a driving TFT.

To solve various problems including the problem described above, one or more embodiments of the present disclosure include a display apparatus with improved light emission uniformity. However, the embodiments disclosed herein are merely examples, and the scope of the present disclosure is not limited thereto.

Additional aspects will be set forth in part in the description which follows and, in part, will be apparent from the description, or may be learned by practice of the presented embodiments.

According to one or more embodiments, a display apparatus includes a pixel including a driving thin film transistor (TFT) and a storage capacitor, wherein the pixel includes: a driving semiconductor layer including a driving channel region, a driving source region, and a driving drain region; a first electrode layer at least partially overlapping the driving channel region in a plane view; a second electrode layer on the first electrode layer and overlapping the first electrode layer in the plane view; a pixel electrode on the second electrode layer; a pixel-defining layer on the pixel electrode and having an opening exposing at least a portion of an upper surface of the pixel electrode and defining a light-emitting region; and a conductive layer between the first electrode layer and the pixel electrode and including an extending portion at least partially overlapping the light-emitting region to pass over a central portion of the light-emitting region.

In the plane view, the light-emitting region may have an overlapping region that overlaps the extending portion, a first region located at one side of the overlapping region, and a second region located at another side of the overlapping region, wherein an area of the first region may be equal to an area of the second region.

The first region and the second region may be symmetrical to each other with respect to the overlapping region.

The extending portion may entirely overlap the light-emitting region.

A driving voltage may be applied to the conductive layer.

The pixel may further include a lower driving voltage line under the conductive layer and above the second electrode layer, and the lower driving voltage line supplies a driving voltage.

The pixel may further include an insulating layer between the lower driving voltage line and the conductive layer, wherein the lower driving voltage line and the conductive layer may be electrically connected to each other through a contact hole defined in the insulating layer.

The pixel may further include a node connection line between the conductive layer and the second electrode layer and having a first side connected to the first electrode layer.

In the plane view, the node connection line may overlap the light-emitting region and the extending portion may cover a region where the node connection line and the light-emitting region overlap each other.

The extending portion may entirely cover the node connection line.

The first electrode layer may have an island form.

The pixel may further include a switching TFT connected to a scan line and a data line; and a compensation TFT configured to be turned on in response to a scan signal of the scan line and to diode-connect the driving TFT, wherein a second side of the node connection line may be connected to the compensation TFT.

The pixel may further include a compensation semiconductor layer including a compensation channel region, a compensation source region, and a compensation drain region; and a compensation TFT including a compensation gate electrode that overlaps the compensation channel region, wherein one of the compensation source region and the compensation drain region may be electrically connected to one of the driving source region and the driving drain region.

The conductive layer may overlap at least a portion of the compensation gate electrode.

The conductive layer may further include a wiring portion that extends in a first direction and to which a driving voltage is applied, wherein the wiring portion may not overlap the light-emitting region.

The extending portion may extend in a second direction intersecting the first direction.

The wiring portion and the extending portion may be integrally formed.

According to one or more embodiments, a display apparatus includes: a first pixel emitting light of a first color and including a first pixel electrode, a second pixel emitting light of a second color and including a second pixel electrode, and a third pixel emitting light of a third color and including a third pixel electrode, wherein each of the first to third pixels includes a driving thin film transistor (TFT) and a storage capacitor; a pixel-defining layer having a first opening exposing at least a portion of an upper surface of the first pixel electrode and defining a first light-emitting region, a second opening exposing at least a portion of an upper surface of the second pixel electrode and defining a second light-emitting region, and a third opening exposing at least a portion of an upper surface of the third pixel electrode and defining a third light-emitting region; a first conductive layer under the first pixel electrode and including a first wiring portion and a first extending portion, wherein the first wiring portion extends in a first direction, and the first extending portion extends from the first wiring portion in a second direction intersecting the first direction and partially overlaps the first light-emitting region in a plane view to pass over a central portion of the first light-emitting region; and a second conductive layer under the second pixel electrode and including a second wiring portion and a second extending portion, wherein the second wiring portion is spaced apart from the first wiring portion by a first distance and extends in the first direction, and the second extending portion extends from the second wiring portion in the second direction, wherein the first extending portion connects the first wiring portion to the second wiring portion.

The first pixel, the second pixel, and the third pixel may be arranged in a PenTile form.

The display apparatus may further include: a third conductive layer under the third pixel electrode and including a third wiring portion and a third extending portion, wherein the third wiring portion is spaced apart from the second wiring portion by a second distance and extends in the first direction, and the second extending portion extends from the third wiring portion in the second direction and partially overlaps the third light-emitting region in the plane view to pass over a central portion of the third light-emitting region, wherein the second extending portion may connect the second wiring portion to the third wiring portion.

The second extending portion may not overlap the second light-emitting region.

A driving voltage that is supplied to the first pixel, the second pixel, and the third pixel may be applied to the first conductive layer, the second conductive layer, and the third conductive layer, and wherein the first wiring portion, the second wiring portion, and the third wiring portion may not overlap the first light-emitting region, the second light-emitting region, and the third light-emitting region, respectively.

According to one or more embodiments, a display apparatus includes: a plurality of driving thin-film transistors (TFTs), each of which includes a driving semiconductor layer and a first electrode layer, wherein the driving semiconductor layer includes a driving channel region, a driving source region, and a driving drain region, and the first electrode layer partially overlaps the driving channel region in a plane view; a plurality of storage capacitors on the first electrode layer, each of the storage capacitors including a second electrode layer that overlaps the first electrode layer in the plane view; a plurality of pixel electrodes on the second electrode layer; a pixel-defining layer on the plurality of pixel electrodes and having a plurality of openings, the plurality of openings exposing at least portions of upper surfaces of the plurality of pixel electrodes and defining a plurality of light-emitting regions; and a plurality of wiring layers between the second electrode layer and the plurality of pixel electrodes, the plurality of wiring layers extending in a first direction and avoiding to overlap the plurality of light-emitting regions in the plane view.

A driving voltage may be applied to the plurality of wiring layers.

The display apparatus may further include: a plurality of mesh connection layers on a same layer as the plurality of wiring layers, wherein the plurality of mesh connection layers extend in a second direction intersecting the first direction and connect the plurality of wiring layers to each other, wherein at least portions of the plurality of mesh connection layers may overlap at least portions of the plurality of light-emitting regions and pass over central portions of the plurality of light-emitting regions.

In the plane view, the at least portions of the plurality of light-emitting regions may have an overlapping region that overlaps the at least portions of the plurality of mesh connection layers, a first region located at one side of the overlapping region, and a second region located at another side of the overlapping region, wherein the first region and the second region may be symmetrical to each other with respect to the overlapping region.

The at least portions of the plurality of mesh connection layers may entirely overlap the at least portions of the plurality of light-emitting regions.

The display apparatus may further include: a plurality of node connection lines on the second electrode layer, a first side of each of the node connection lines being electrically connected to the first electrode layer, wherein at least portions of the plurality of node connection lines may overlap at least portions of the plurality of light-emitting regions.

The plurality of mesh connection layers may overlap and cover the plurality of node connection lines in the plane view.

The plurality of wiring layers and the plurality of mesh connection layers may be integrally formed and have a mesh structure.

Aspects, features, and advantages other than the aforementioned descriptions may be understood more readily by reference to the following accompanying drawings, claims, and detailed descriptions of embodiments.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
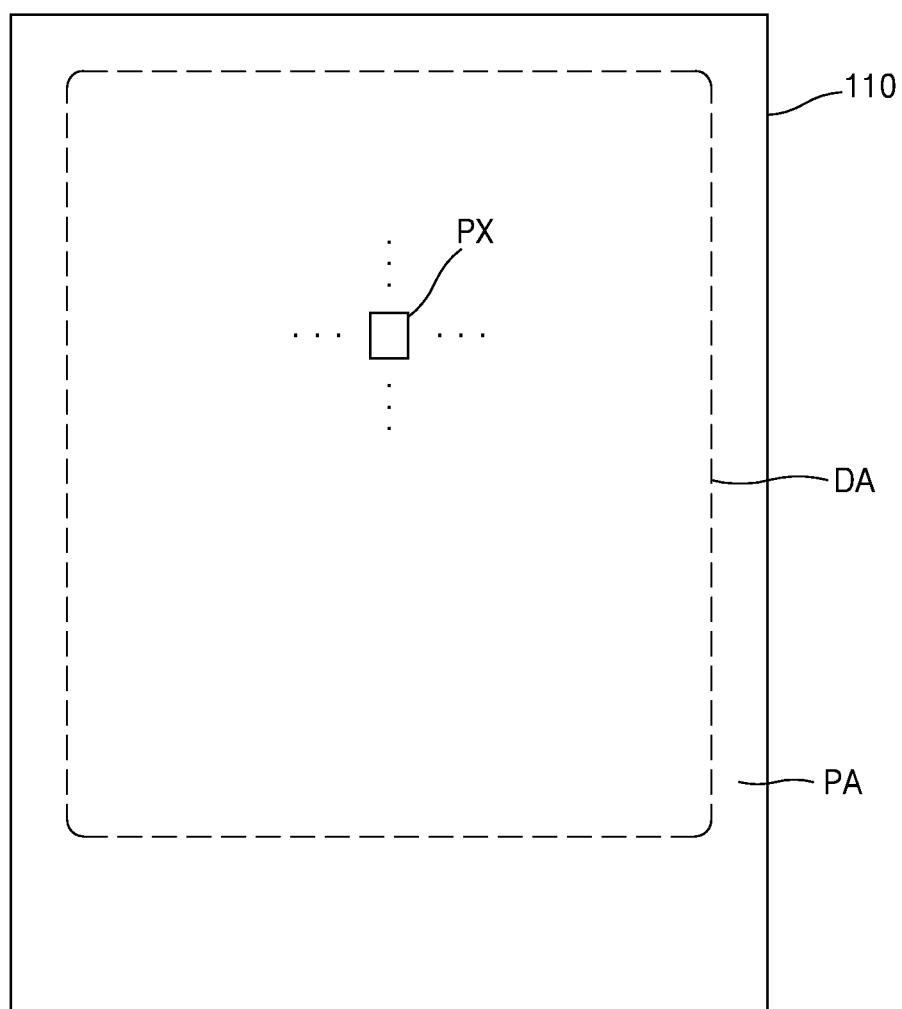
FIG. 1 is a plan view of a display apparatus according to an embodiment.

As the disclosure allows for various changes and numerous embodiments, particular embodiments of the present disclosure will be illustrated in the drawings and described in detail in the written description. Effects and features of the present disclosure and methods of accomplishing the same may be understood more readily by reference to the following detailed description of example embodiments and the accompanying drawings. The present disclosure may, however, be embodied in many different forms and should not be construed as being limited to the example embodiments set forth herein.

Reference will now be made in detail to embodiments, examples of which are illustrated in the accompanying drawings, wherein components that are the same or are in correspondence are rendered the same reference numeral throughout the drawings unless explicitly stated otherwise, and redundant explanations are omitted.

Throughout the specification, terms as "first," "second," etc., may not be used for purposes of limitation but may be used to distinguish one component from another.

Throughout the specification, a singular form may include plural forms, unless there is a particular description contrary thereto.

Throughout the specification, it will be further understood that the terms "comprise", "include," and/or "have," when used in the specification, specify the presence of stated features, and/or components, but do not preclude the presence or addition of one or more other features, and/or components.

It will be understood that when a film, region, or element is referred to as being "on" another portion, it may be directly or indirectly on the other portion. That is, for example, intervening films, regions, or elements may be present.

In the drawings, the thicknesses of layers and regions are exaggerated for clarity. For example, the thicknesses and sizes of elements in the drawings are arbitrarily shown for convenience of description, thus, the spirit and scope of the present disclosure are not necessarily defined by the drawings.

In addition, it should also be noted that in some alternative implementations, the steps of all methods described herein may occur in a different order. For example, two steps illustrated in succession may in fact be executed substantially concurrently or the two steps may sometimes be executed in a reverse order.

Throughout the specification, it will also be understood that when a layer, a region, an element, or the like is referred to as being "connected to" or "coupled with" another layer, region, or element, it can be directly connected to or coupled with the other layer, region, or element, or it can be indirectly connected to or coupled with the other layer, region, or element by having one or more intervening layers, regions, or elements interposed therebetween. For example, throughout the specification, when a layer, a region, an element, or the like is referred to as being "electrically connected to" or "electrically coupled with" another layer, region, or element, it can be electrically connected to or coupled with the other layer, region, or element in a direct manner, or it can be electrically connected to or coupled with the other layer, region, or element in an indirect manner by having one or more intervening layers, regions, or elements interposed therebetween.

As used herein, the term "and/or" includes any and all combinations of one or more of the associated listed items. Expressions such as "at least one of," when preceding a list of elements, may modify the entire list of elements and may not modify the individual elements of the list.

A display apparatus is an apparatus for displaying an image, and may be a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, a cathode ray display apparatus, etc.

Hereinafter, as a display apparatus according to an embodiment, an organic light-emitting display apparatus will be described as an example. However, a display apparatus of the present disclosure is not limited thereto, and may be one of various types of display apparatuses without departing from the scope of the present disclosure.

FIG. 1 is a plan view of a display apparatus according to an embodiment.

Referring to FIG. 1, the display apparatus includes a substrate 110. The substrate 110 has a display area DA and a peripheral area PA outside the display area DA.

A plurality of pixels PX including various display devices or elements such as an organic light-emitting diode (OLED) may be arranged in the display area DA of the substrate 110. A variety of wirings for transmitting electrical signals to the display area DA may be positioned in the peripheral area PA of the substrate 110. Hereinafter, for convenience of explanation, a display apparatus including an OLED as a display device or element is described. However, the present disclosure is not limited thereto.

Figure 2:
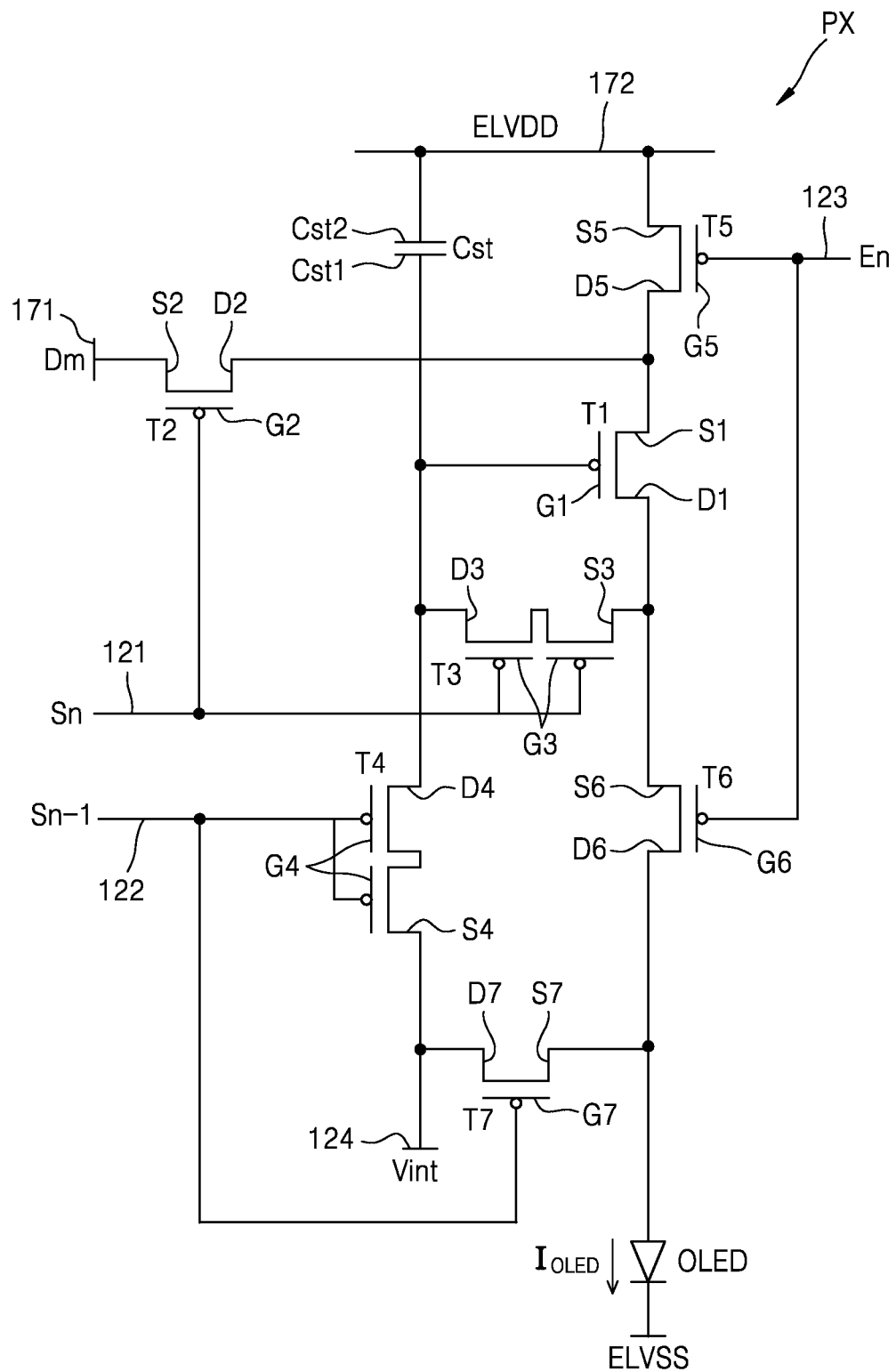
FIG. 2 is an equivalent circuit diagram of one of a plurality of pixels provided in the display apparatus of FIG. 1.

FIG. 2 is an equivalent circuit diagram of one of the pixels PX provided in the display apparatus of FIG. 1.

Referring to FIG. 2, one of the pixels PX may include a plurality of signal lines 121, 122, 123, and 171, a plurality of thin film transistors (TFTs) T1, T2, T3, 4, T5, T6, and T7 connected to the signal lines, a storage capacitor Cst, an initialization voltage line 124, a driving voltage line 172, and the OLED.

FIG. 2 illustrates an example in which the signal lines 121, 122, 123, and 171 and the driving voltage line 172 are provided for each pixel PX, but the present disclosure is not limited thereto. In another embodiment, at least one of the signal lines 121, 122, 123, and 171 and/or the driving voltage line 172 may be shared with neighboring pixels.

The TFTs T1, T2, T3, T4, T5, T6, and T7 may include a driving TFT T1, a switching TFT T2, a compensation TFT T3, a first initialization TFT T4, an operation control TFT T5, an emission control TFT T6, and a second initialization TFT T7.

The signal lines 121, 122, 123, and 171 may include a scan line 121 for transmitting a scan signal Sn, a previous scan line 122 for transmitting a previous scan signal Sn−1 to the first initialization TFT T4 and the second initialization TFT T7, an emission control line 123 for transmitting an emission control signal En to the operation control TFT T5 and the emission control TFT T6, and a data line 171 for transmitting a data signal Dm, the data line 171 intersecting the scan line 121. The driving voltage line 172 transmits a driving voltage ELVDD and is formed substantially parallel to the data line 171, and the initialization voltage line 124 transmits an initialization voltage Vint to initialize the driving TFT T1.

A driving gate electrode G1 of the driving TFT T1 is connected to a first storage capacitor plate Cst1 of the storage capacitor Cst. A driving source electrode S1 of the driving TFT T1 is connected to the driving voltage line 172 that is a lower driving voltage line, via the operation control TFT T5. A driving drain electrode D1 of the driving TFT T1 is electrically connected to a pixel electrode of the OLED via the emission control TFT T6. According to a switching operation of the switching TFT T2, the driving TFT T1 receives the data signal Dm and supplies a driving current IDLED to the OLED.

A switching gate electrode G2 of the switching TFT T2 is connected to the scan line 121. A switching source electrode S2 of the switching TFT T2 is connected to the data line 171. A switching drain electrode D2 of the switching TFT T2 is connected to the driving source electrode S1 of the driving TFT T1 and to the driving voltage line 172 via the operation control TFT T5. The switching TFT T2 is turned on in response to the scan signal Sn received through the scan line 121 and performs the switching operation of transmitting the data signal Dm received through the data line 171 to the driving source electrode S1 of the driving TFT T1.

A compensation gate electrode G3 of the compensation TFT T3 is connected to the scan line 121. A compensation source electrode S3 of the compensation TFT T3 is connected to the driving drain electrode D1 of the driving TFT T1 and is connected to the pixel electrode of the OLED via the emission control TFT T6. A compensation drain electrode D3 of the compensation TFT T3 is connected to the first storage capacitor plate Cst1 of the storage capacitor Cst, a first initialization drain electrode D4 of the first initialization TFT T4, and the driving gate electrode G1 of the driving TFT T1. The compensation TFT T3 is turned on in response to the scan signal Sn received through the scan line 121 and electrically connects the driving gate electrode G1 and the driving drain electrode D1 of the driving TFT T1, thereby having the driving TFT T1 diode-connected.

A first initialization gate electrode G4 of the first initialization TFT T4 is connected to the previous scan line 122. A first initialization source electrode S4 of the first initialization TFT T4 is connected to a second initialization drain electrode D7 of the second initialization TFT T7 and the initialization voltage line 124. The first initialization drain electrode D4 of the first initialization TFT T4 is connected to the first storage capacitor plate Cst1 of the storage capacitor Cst, the compensation drain electrode D3 of the compensation TFT T3, and the driving gate electrode G1 of the driving TFT T1. The first initialization TFT T4 is turned on in response to the previous scan signal Sn−1 received through the previous scan line 122 and performs an initialization operation to initialize a voltage of the driving gate electrode G1 of the driving TFT T1 by transmitting the initialization voltage Vint to the driving gate electrode G1 of the driving TFT T1.

An operation control gate electrode G5 of the operation control TFT T5 is connected to the emission control line 123. An operation control source electrode S5 of the operation control TFT T5 is connected to the driving voltage line 172. An operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line 123. An emission control source electrode S6 of the emission control TFT T6 is connected to the driving drain electrode D1 of the driving TFT T1 and the compensation source electrode S3 of the compensation TFT T3. An emission control drain electrode D6 of the emission control TFT T6 is electrically connected to a second initialization source electrode S7 of the second initialization TFT T7 and the pixel electrode of the OLED.

The operation control TFT T5 and the emission control TFT T6 are simultaneously turned on in response to the emission control signal En received through the emission control line 123, and thus the driving voltage ELVDD is transmitted to the OLED, and the driving current IDLED flows through the OLED.

A second initialization gate electrode G7 of the second initialization TFT T7 is connected to the previous scan line 122. The second initialization source electrode S7 of the second initialization TFT T7 is connected to the emission control drain electrode D6 of the emission control TFT T6 and the pixel electrode of the OLED. The second initialization drain electrode D7 of the second initialization TFT T7 is connected to the first initialization source electrode S4 of the first initialization TFT T4 and the initialization voltage line 124. The second initialization TFT T7 is turned on in response to the previous scan signal Sn−1 received through the previous scan line 122 and initializes the pixel electrode of the OLED.

Although FIG. 2 illustrates an example in which the first initialization TFT T4 and the second initialization TFT T7 are connected to the previous scan line 122, the present disclosure is not limited thereto. In another embodiment, the first initialization TFT T4 may be connected to the previous scan line 122 and driven by the previous scan signal Sn−1 and the second initialization TFT T7 may be connected to a separate signal line (e.g., a next scan line) and driven by a signal transmitted to the separate signal line.

A second storage capacitor plate Cst2 of the storage capacitor Cst is connected to the driving voltage line 172 and an opposite electrode of the OLED is connected to a common voltage ELVSS. Accordingly, the OLED may display an image by receiving the driving current IDLED from the driving TFT T1 and emitting light.

Although FIG. 2 illustrates an example in which each of the compensation TFT T3 and the first initialization TFT T4 has a dual gate electrode, the present disclosure is not limited thereto. For example, each of the compensation TFT T3 and the first initialization TFT T4 may have a single gate electrode. In addition, various modifications are possible such that at least one of the driving TFT T1, the switching TFT T2, the operation control TFT T5, the emission control TFT T6, and the second initialization TFT T7 may have a dual gate electrode.

A detailed operation of each pixel PX according an embodiment is described below.

During an initialization period, when the previous scan signal Sn−1 is supplied through the previous scan line 122, the first initialization TFT T4 is turned on in response to the previous scan signal Sn−1 and the driving TFT T1 is initialized by the initialization voltage Vint supplied through the initialization voltage line 124.

During a data programming period, when the scan signal Sn is supplied through the scan line 121, the switching TFT T2 and the compensation TFT T3 are turned on in response to the scan signal Sn. In this case, the driving TFT T1 is diode-connected by the compensation TFT T3 that is turned on, and is biased in a forward direction.

Then, a compensated voltage Dm+Vth is applied to the driving gate electrode G1 of the driving TFT T1. The compensated voltage Dm+Vth is obtained by subtracting a threshold voltage Vth of the driving TFT T1 from the data signal Dm of the data line 171.

The driving voltage ELVDD and the compensated voltage Dm+Vth are applied to both ends of the storage capacitor Cst, and electric charges corresponding to a voltage difference between both ends are stored in the storage capacitor Cst.

During an emission period, the operation control TFT T5 and the emission control TFT T6 are turned on by the emission control signal En supplied through the emission control line 123. The driving current IDLED according to a voltage difference between a voltage of the driving gate electrode G1 of the driving TFT T1 and the driving voltage ELVDD is generated, and the driving current IDLED is supplied to the OLED through the emission control TFT T6.

Hereinafter, a detailed structure of the pixel PX shown in FIG. 2 is described with reference to FIGS. 3 to 10.

Figure 3:
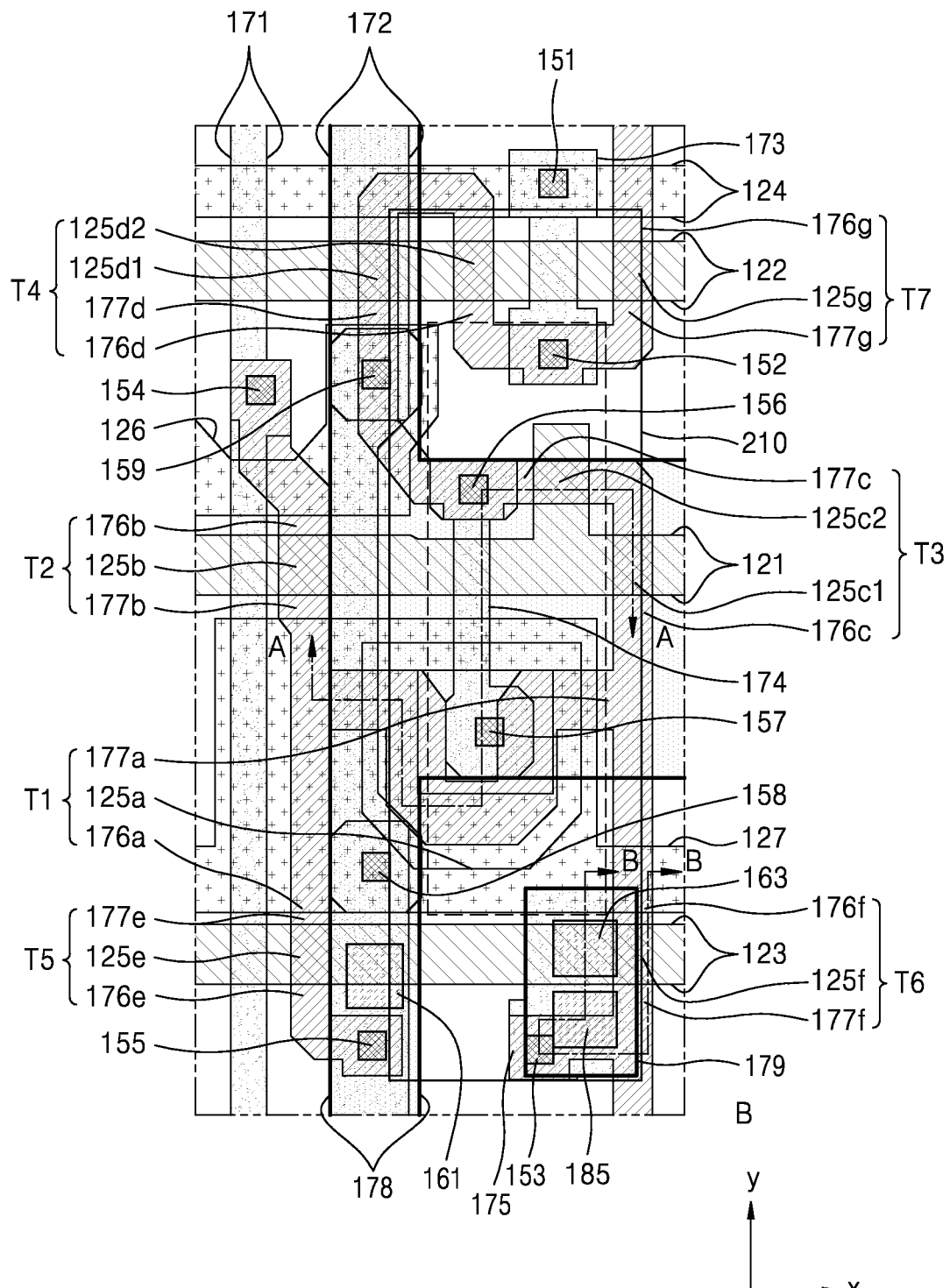
FIG. 3 is a layout schematically illustrating positions of a plurality of thin film transistors (TFTs), a storage capacitor, and a pixel electrode of the pixel of FIG. 2.

FIG. 3 is a layout schematically illustrating positions of a plurality of TFTs, a storage capacitor, and a pixel electrode of the pixel PX of FIG. 2. FIGS. 4 to 9 are layouts schematically illustrating elements, such as the plurality of TFTs, the storage capacitor, and the pixel electrode shown in FIG. 3, layer by layer. FIG. 10 is a cross-sectional view taken along lines A-A and B-B of FIG. 3.

Each of FIGS. 4 to 9 illustrates arrangements of a wiring, an electrode, a semiconductor layer, and the like located on the same layer, and an insulating layer may be interposed between layers shown in FIGS. 4 to 9. For example, a first gate insulating layer 141 (see FIG. 10) is interposed between a layer shown in FIG. 4 and a layer shown in FIG. 5, and a second gate insulating layer 143 (see FIG. 10) is interposed between a layer shown in FIG. 5 and a layer shown in FIG. 6. A first interlayer insulating layer 150 (see FIG. 10) is interposed between a layer shown in FIG. 6 and a layer shown in FIG. 7, and a second interlayer insulating layer 160 (see FIG. 10) is interposed between a layer shown in FIG. 7 and a layer shown in FIG. 8. A planarization insulating layer 180 (see FIG. 10) is interposed between a layer shown in FIG. 8 and a layer shown in FIG. 9. Through a contact hole defined in at least some of the above-described insulating layers, the layers shown in FIGS. 4 to 9 may be electrically connected to each other.

Referring to FIG. 3, the pixel PX includes the scan line 121, the previous scan line 122, the emission control line 123, and the initialization voltage line 124, to which the scan signal Sn, the previous scan signal Sn–1, the emission control signal En, and the initialization voltage Vint are respectively applied. The pixel PX includes the scan line 121, the previous scan line 122, the emission control line 123, and the initialization voltage line 124 extend in a second direction (x direction, hereinafter also referred to as "row direction"). The pixel PX may include the data line 171 and the driving voltage line 172 that extend in a first direction (y direction, hereinafter also referred to as "column direction") to intersect the scan line 121, the previous scan line 122, the emission control line 123, and the initialization voltage line 124. The data signal Dm and the driving voltage ELVDD are respectively applied to the data line 171 and the driving voltage line 172. The pixel PX includes a conductive layer 178 that prevents or reduces the generation of parasitic capacitance. The pixel PX further includes the TFTs T1 to T7, the storage capacitor Cst, and the OLED (see FIG. 10) electrically connected to the TFTs T1 to T7 and the storage capacitor Cst. Hereinafter, for convenience of explanation, descriptions are provided in accordance with a stacking order. It is understood that the stacking order illustrated with respect to FIGS. 3 to 10 may vary without deviating from the scope of the present disclosure.

Figure 4:
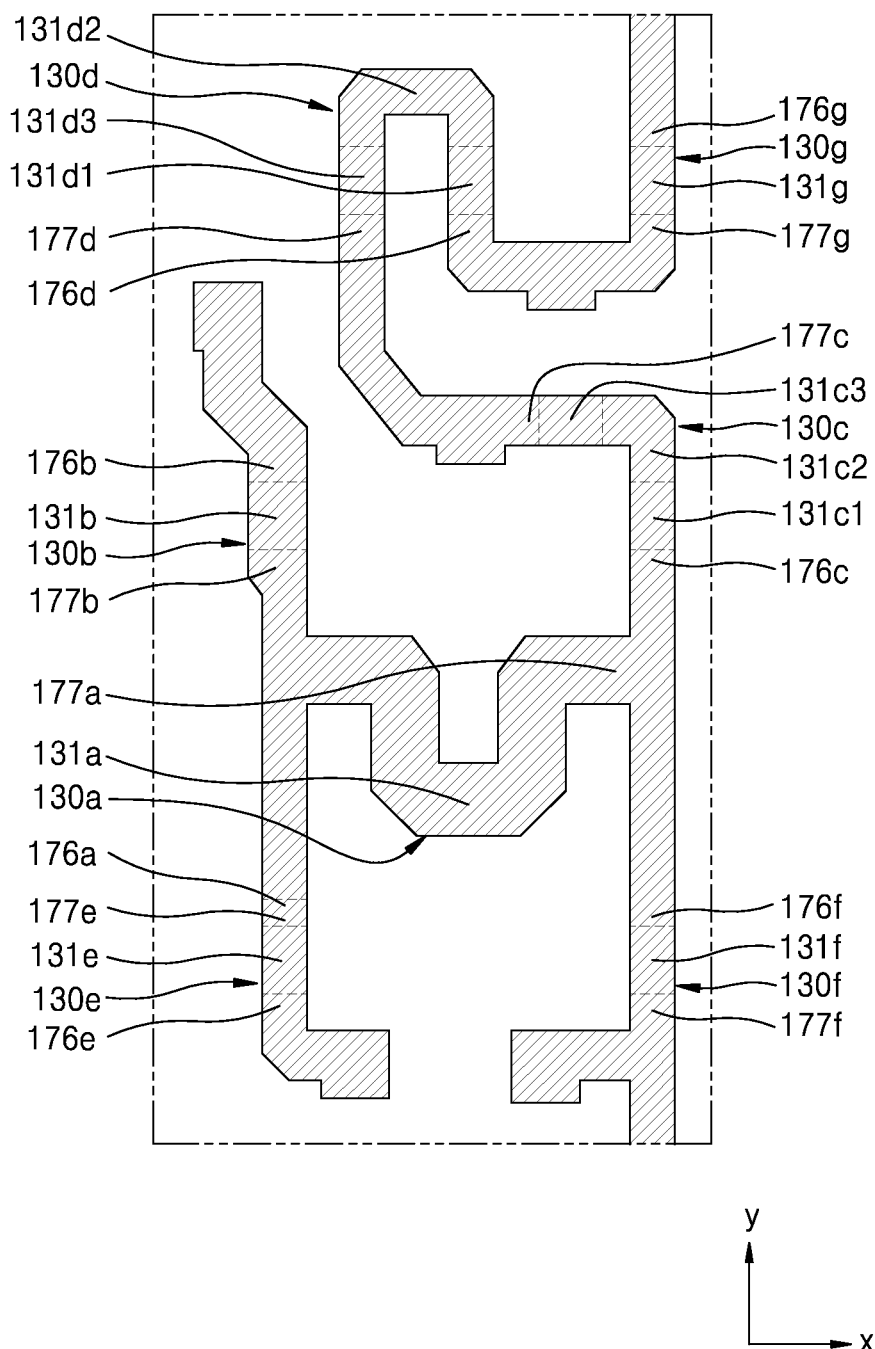
FIG. 4 is a plan view of one layer among layers in FIG. 3.

Referring to FIGS. 3, 4, and 10, semiconductor layers 130a to 130g, that is, a driving semiconductor layer 130a of the driving TFT T1, a switching semiconductor layer 130b of the switching TFT T2, a compensation semiconductor layer 130c of the compensation TFT T3, a first initialization semiconductor layer 130d of the first initialization TFT T4, an operation control semiconductor layer 130e of the operation control TFT T5, an emission control semiconductor layer 130f of the emission control TFT T6, and a second initialization semiconductor layer 130g of the second initialization TFT T7, are arranged in the same layer.

The semiconductor layers 130a to 130g are arranged on a buffer layer 111 located on the substrate 110. The substrate 110 may include a glass material, a metal material, or a plastic material such as polyethylene terephthalate (PET), polyethylenenaphthalate (PEN), or polyimide. The buffer layer 111 may include an oxide film such as silicon oxide (SiOx) and/or a nitride film such as silicon nitride (SiNx).

The driving semiconductor layer 130a of the driving TFT T1, the switching semiconductor layer 130b of the switching TFT T2, the compensation semiconductor layer 130c of the compensation TFT T3, the first initialization semiconductor layer 130d of the first initialization TFT T4, the operation control semiconductor layer 130e of the operation control TFT T5, the emission control semiconductor layer 130f of the emission control TFT T6, and the second initialization semiconductor layer 130g of the second initialization TFT T7 may be connected to one another and curved in various shapes.

The semiconductor layers 130a to 130g may include polycrystalline silicon. Alternatively, the semiconductor layers 130a to 130g may include amorphous silicon or an oxide semiconductor layer such as a G-I-Z-O layer [$(In_2O_3)a(Ga_2O_3)b(ZnO)c$ layer] (where a, b, and c are real numbers satisfying the conditions of a≥0, b≥0, and c>0, respectively). Hereinafter, for convenience of explanation, an example in which the semiconductor layers 130a to 130g include polycrystalline silicon is described.

The semiconductor layers 130a to 130g may include a channel region, and a source region and a drain region provided at both sides of the channel region. For example, the source region and the drain region may be doped with impurities, and the impurities may include N-type impurities or P-type impurities. The source region and the drain region are electrically connected to a source electrode and a drain electrode, respectively, and thus correspond to the source electrode and the drain electrode, respectively. Hereinafter, the source electrode and the drain electrode are respectively referred to as the source region and the drain region.

The driving semiconductor layer 130a includes a driving channel region 131a, and a driving source region 176a and a driving drain region 177a provided at both sides of the driving channel region 131a. The driving channel region 131a may be formed longer than the other channel regions 131b to 131g. For example, as the driving channel region 131a has a multiply bent shape such as "S" or "Ω", a long channel length may be attained in a narrow space. Since the driving channel region 131a is formed long, a driving range of a gate voltage applied to a first electrode layer 125a (i.e., the driving gate electrode G1 of the driving TFT T1) increases, and thus gradation of light emitted from the OLED may be more accurately controlled, thereby improving display quality.

The switching semiconductor layer 130b includes a switching channel region 131b, and a switching source region 176b and a switching drain region 177b provided at both sides of the switching channel region 131b. The switching drain region 177b is connected to the driving source region 176a.

The compensation semiconductor layer 130c includes compensation channel regions 131c1 and 131c3, and a compensation source region 176c and a compensation drain region 177c provided at both sides of the compensation channel regions 131c1 and 131c3. The compensation TFT T3 formed in the compensation semiconductor layer 130c is a dual TFT and includes two compensation channel regions 131c1 and 131c3. A region 131c2 between the compensation channel regions 131c1 and 131c3 is an impurity-doped region, and locally corresponds to a source region of one transistor of the dual TFT and a drain region of the other transistor of the dual TFT.

The first initialization semiconductor layer 130d includes first initialization channel regions 131d1 and 131d3, and a first initialization source region 176d and a first initialization drain region 177d provided at both sides of the first initialization channel regions 131d1 and 131d3. The first initialization TFT T4 formed in the first initialization semiconductor layer 130d is a dual TFT and includes two first initialization channel regions 131d1 and 131d3. A region 131d2 between the first initialization channel regions 131d1 and 131d3 is an impurity-doped region, and locally corresponds to a source region of one transistor of the dual TFT and a drain region of the other transistor of the dual TFT.

The operation control semiconductor layer 130e includes an operation control channel region 131e, and an operation control source region 176e and an operation control drain region 177e provided at both sides of the operation control channel region 131e. The operation control drain region 177e may be connected to the driving source region 176a.

The emission control semiconductor layer 130f includes an emission control channel region 131f, and an emission control source region 176f and an emission control drain region 177f provided at both sides of the emission control channel region 131f. The emission control source region 176f may be connected to the driving drain region 177a.

The second initialization semiconductor layer 130g includes a second initialization channel region 131g, and a second initialization source region 176g and a second initialization drain region 177g provided at both sides of the second initialization channel region 131g.

Referring to FIG. 10, the first gate insulating layer 141 is located on the semiconductor layers 130a to 130g. The first gate insulating layer 141 may include an inorganic material including an oxide or a nitride. For example, the first gate insulating layer 141 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

Figure 5:
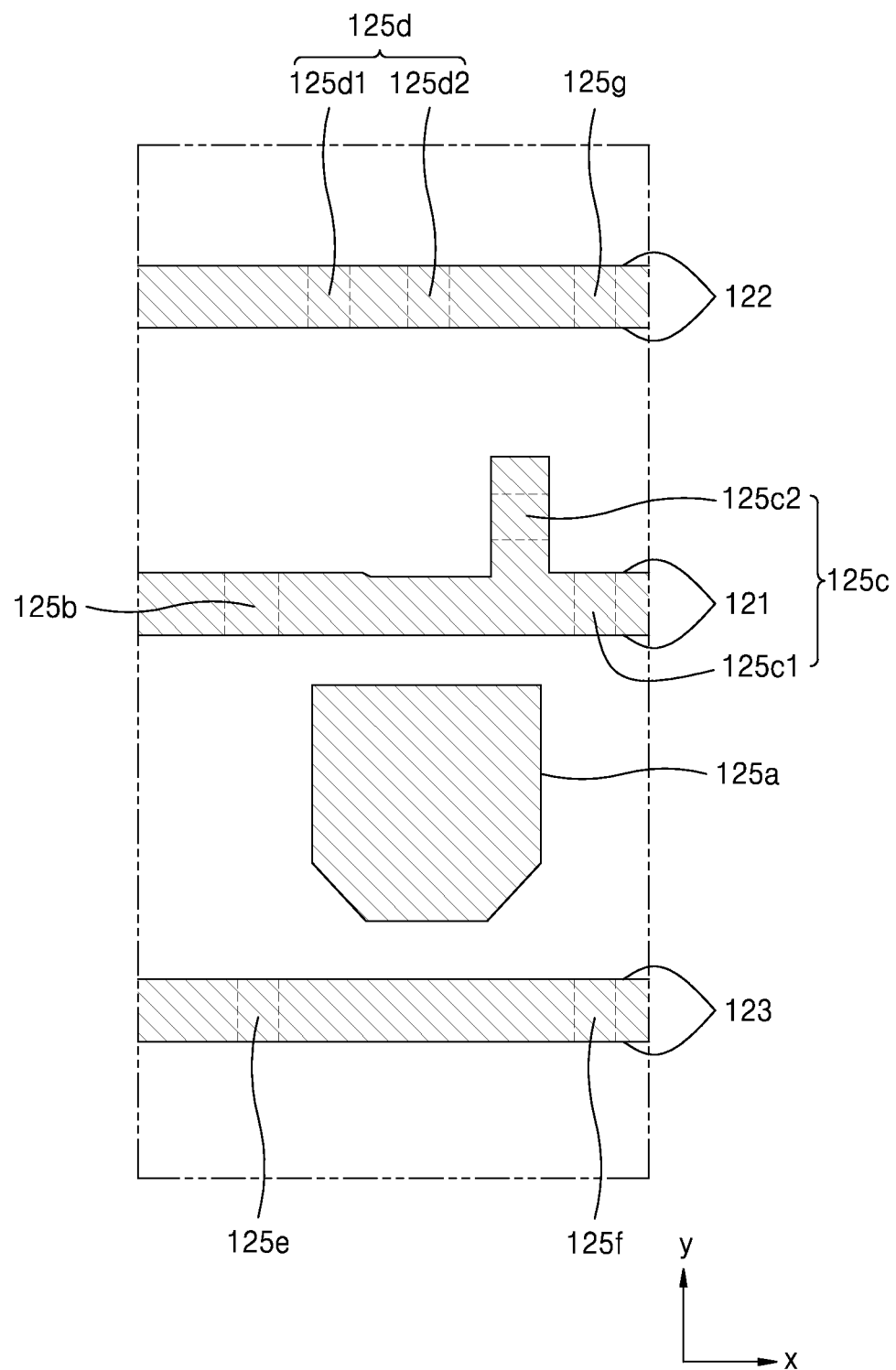
FIG. 5 is a plan view of another layer among the layers in FIG. 3.

Referring to FIGS. 3, 5, and 10, the scan line 121, the previous scan line 122, the emission control line 123, and the first electrode layer 125a are located on the first gate insulating layer 141. In one embodiment, the scan line 121, the previous scan line 122, the emission control line 123, and the first electrode layer 125a may include the same material. For example, the scan line 121, the previous scan line 122, the emission control line 123, and the first electrode layer 125a may include molybdenum (Mo), aluminum (Al), copper (Cu), titanium (Ti), or the like, and may include a single layer or multiple layers.

Parts and protruding portions of the scan line 121, the previous scan line 122, the emission control line 123, and the first electrode layer 125a respectively correspond to the gate electrodes of the TFTs T1 to T7. That is, portions of the scan line 121, the previous scan line 122, the emission control line 123, and the first electrode layer 125a that overlap the semiconductor layers 130a to 130g are defined as gate electrodes.

A region of the scan line 121 that overlaps the switching channel region 131b corresponds to a switching gate electrode 125b, and regions of the scan line 121 that overlap the compensation channel regions 131c1 and 131c3 correspond to compensation gate electrodes 125c1 and 125c2. Regions of the previous scan line 122 that overlap the first initialization channel regions 131d1 and 131d3 correspond to first initialization gate electrodes 125d1 and 125d2, and a region of the previous scan line 122 that overlaps the second initialization channel region 131g corresponds to a second initialization gate electrode 125g. A region of the emission control line 123 that overlaps the operation control channel region 131e corresponds to an operation control gate electrode 125e, and a region of the emission control line 123 that overlaps the emission control channel region 131f corresponds to an emission control gate electrode 125f.

The compensation gate electrodes 125c1 and 125c2 correspond to a dual gate electrode including a first compensation gate electrode 125c1 and a second compensation gate electrode 125c2 and may prevent or reduce the occurrence of a leakage current.

A portion of the first electrode layer 125a that overlaps the driving channel region 131a corresponds to the driving gate electrode G1 of the driving TFT T1. The first electrode layer 125a is used as the driving gate electrode G1 of the driving TFT T1 and the first storage capacitor plate Cst1 of the storage capacitor Cst. In other words, it may be understood that the driving gate electrode G1 of the driving TFT T1 and the first storage capacitor plate Cst1 of the storage capacitor Cst are integrally formed.

Referring to FIG. 10, the second gate insulating layer 143 is located on the scan line 121, the previous scan line 122, the emission control line 123, and the first electrode layer 125a. The second gate insulating layer 143 may include an inorganic material including an oxide or a nitride. For example, the second gate insulating layer 143 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

Figure 6:
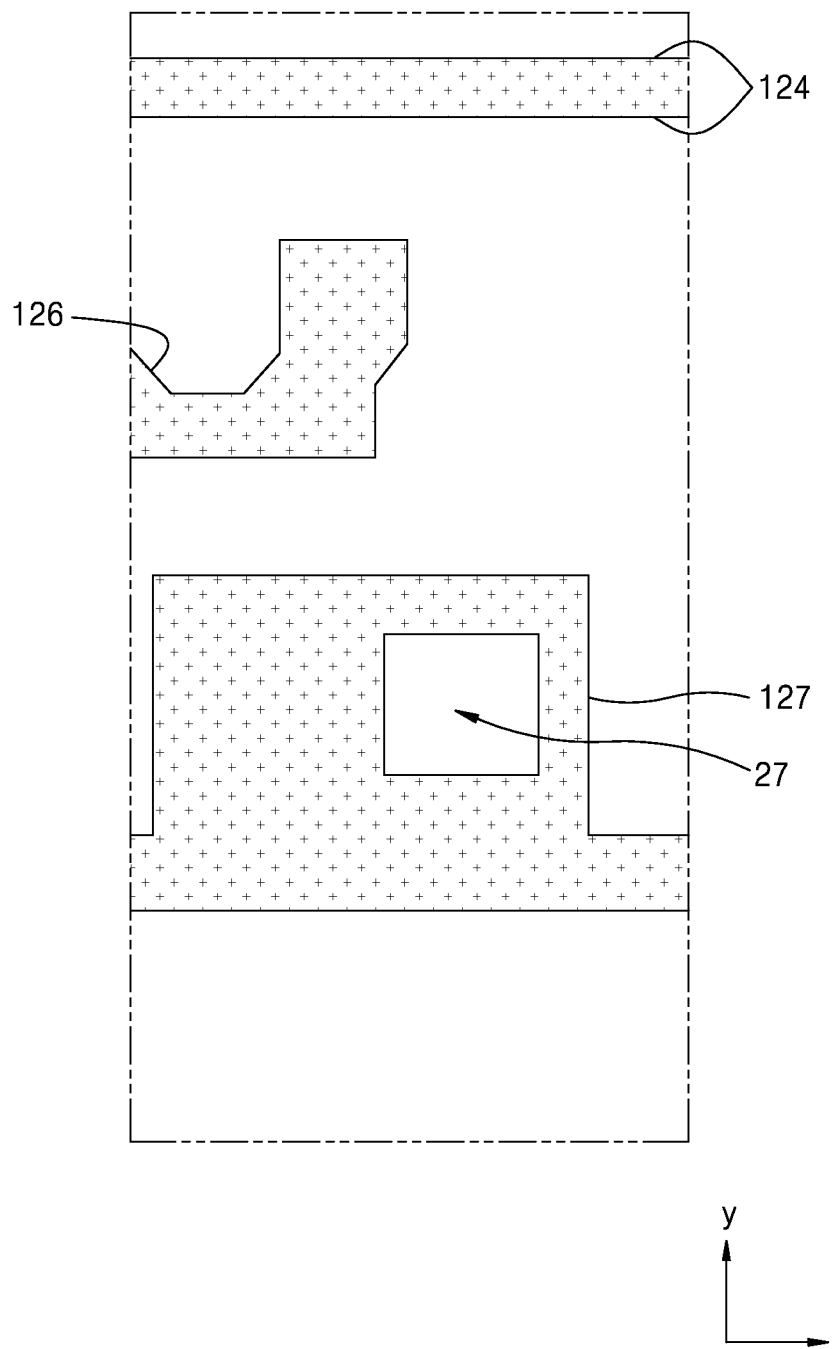
FIG. 6 is a plan view of another layer among the layers in FIG. 3.

Referring to FIGS. 3, 6, and 10, the initialization voltage line 124, a plate 126, and a second electrode layer 127 are located on the second gate insulating layer 143. In one embodiment, the initialization voltage line 124, the plate 126, and the second electrode layer 127 may include the same material. For example, the initialization voltage line 124, the plate 126, and the second electrode layer 127 may include molybdenum (Mo), aluminum (Al), copper (Cu), titanium (Ti), or the like, and may include a single layer or multiple layers.

Portions of the initialization voltage line 124 that overlap the first and second initialization channel regions 131d1, 131d3, and 131g correspond to the first and second initialization gate electrodes 125d1, 125d2, and 125g, respectively.

The plate 126 is electrically connected to the driving voltage line 172 through a contact hole 159, as shown in FIG. 3, and may cover a portion of the switching source region 176b. In some embodiments, the plate 126 may cover the second initialization drain region 177g and/or the first initialization source region 176d. The plate 126 that is electrically connected to the driving voltage line 172 to which a constant voltage (i.e., the driving voltage ELVDD) is applied may reduce or block influence on the switching TFT T2 and the first and second initialization TFTs T4 and T7 by other peripheral electrical signals.

The second electrode layer 127 overlaps the first electrode layer 125a with the second gate insulating layer 143 between the second electrode layer 127 and the first electrode layer 125a. The second electrode layer 127 corresponds to the second storage capacitor plate Cst2 of the storage capacitor Cst.

The second electrode layer 127 includes an opening 27 exposing a portion of the first electrode layer 125a. One end of a node connection line 174 is electrically connected to the first electrode layer 125a through the opening 27.

Referring to FIG. 10, the first interlayer insulating layer 150 is located on the initialization voltage line 124, the plate 126, and the second electrode layer 127. The first interlayer insulating layer 150 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

Figure 7:
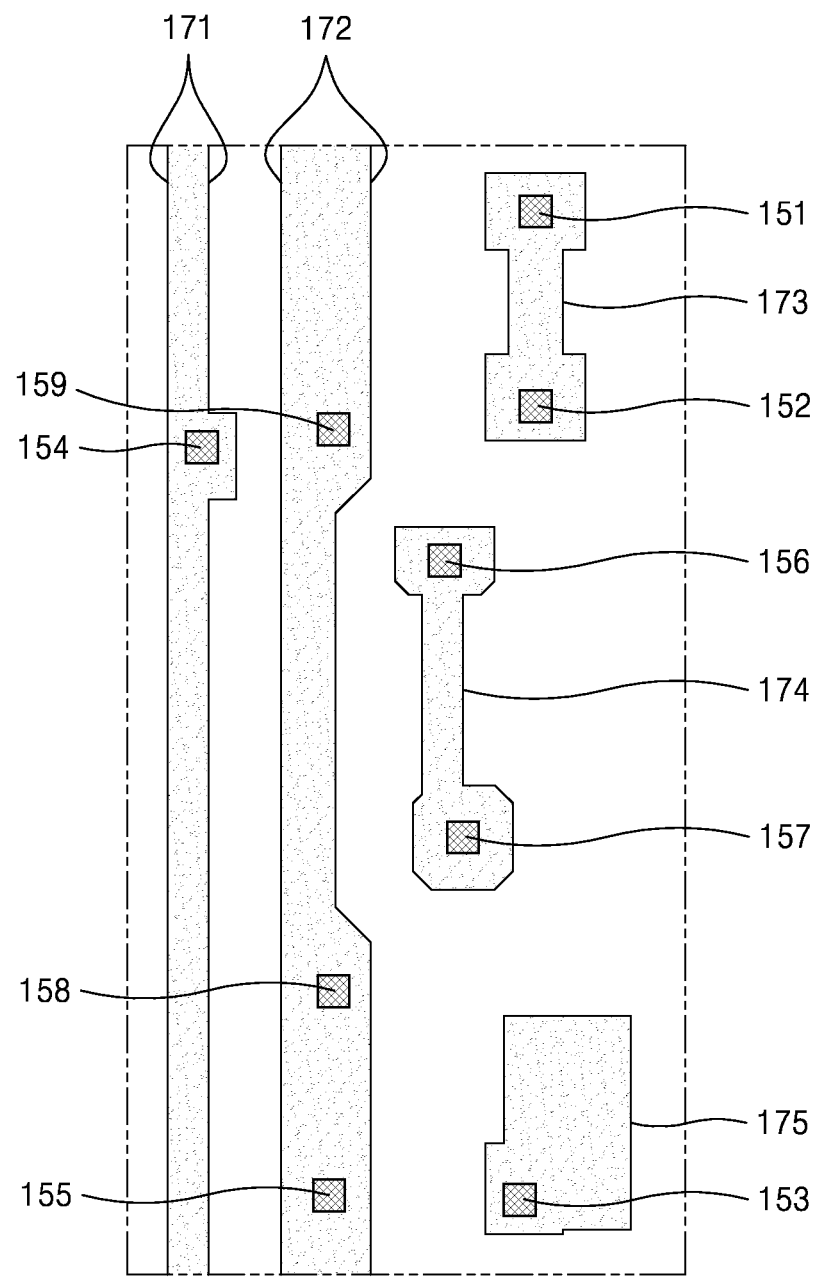
FIG. 7 is a plan view of another layer among the layers in FIG. 3.

Referring to FIGS. 3, 7, and 10, the data line 171, the driving voltage line 172, an initialization connection line 173, the node connection line 174, and an intermediate connection layer 175 are located on the first interlayer insulating layer 150.

The data line 171, the driving voltage line 172, the initialization connection line 173, the node connection line 174, and the intermediate connection layer 175 may include the same material. For example, the data line 171, the driving voltage line 172, the initialization connection line 173, the node connection line 174, and the intermediate connection layer 175 may include a conductive material including molybdenum (Mo), aluminum (Al), copper (Cu), titanium (Ti), or the like, and may include a single layer or multiple layers including the conductive material. For example, the data line 171, the driving voltage line 172, the initialization connection line 173, the node connection line 174, and the intermediate connection layer 175 may have a multilayered structure of Ti/Al/Ti.

The data line 171 extends in the column direction (y direction) and is connected to the switching source region 176b of the switching TFT T2 through a contact hole 154 defined in the first interlayer insulating layer 150.

The driving voltage line 172 extends in the column direction (y direction) and is connected to the operation control source region 176e of the operation control TFT T5 and the second electrode layer 127 respectively through contact holes 155 and 158 defined in the first interlayer insulating layer 150. The driving voltage line 172 may be connected to the plate 126 through the contact hole 159 defined in the first interlayer insulating layer 150.

The initialization connection line 173 connects the initialization source region 176d of the first initialization TFT T4 to the initialization voltage line 124 through contact holes 151 and 152 defined in the first interlayer insulating layer 150.

The node connection line 174 connects the first electrode layer 125a to the compensation drain region 177c of the compensation TFT T3 through contact holes 156 and 157. The first electrode layer 125a having an island shape may be electrically connected to the compensation TFT T3 via the node connection line 174.

The intermediate connection layer 175 is connected to the emission control TFT T6 through a contact hole 153. For example, the intermediate connection layer 175 may be connected to the emission control drain region 177f of the emission control TFT T6.

Referring to FIG. 10, the second interlayer insulating layer 160 is located on the data line 171, the driving voltage line 172, the initialization connection line 173, the node connection line 174, and the intermediate connection layer 175. The second interlayer insulating layer 160 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In some embodiments, the second interlayer insulating layer 160 may include a film including the above-described inorganic insulating material and a film including an organic insulating material.

Figure 8:
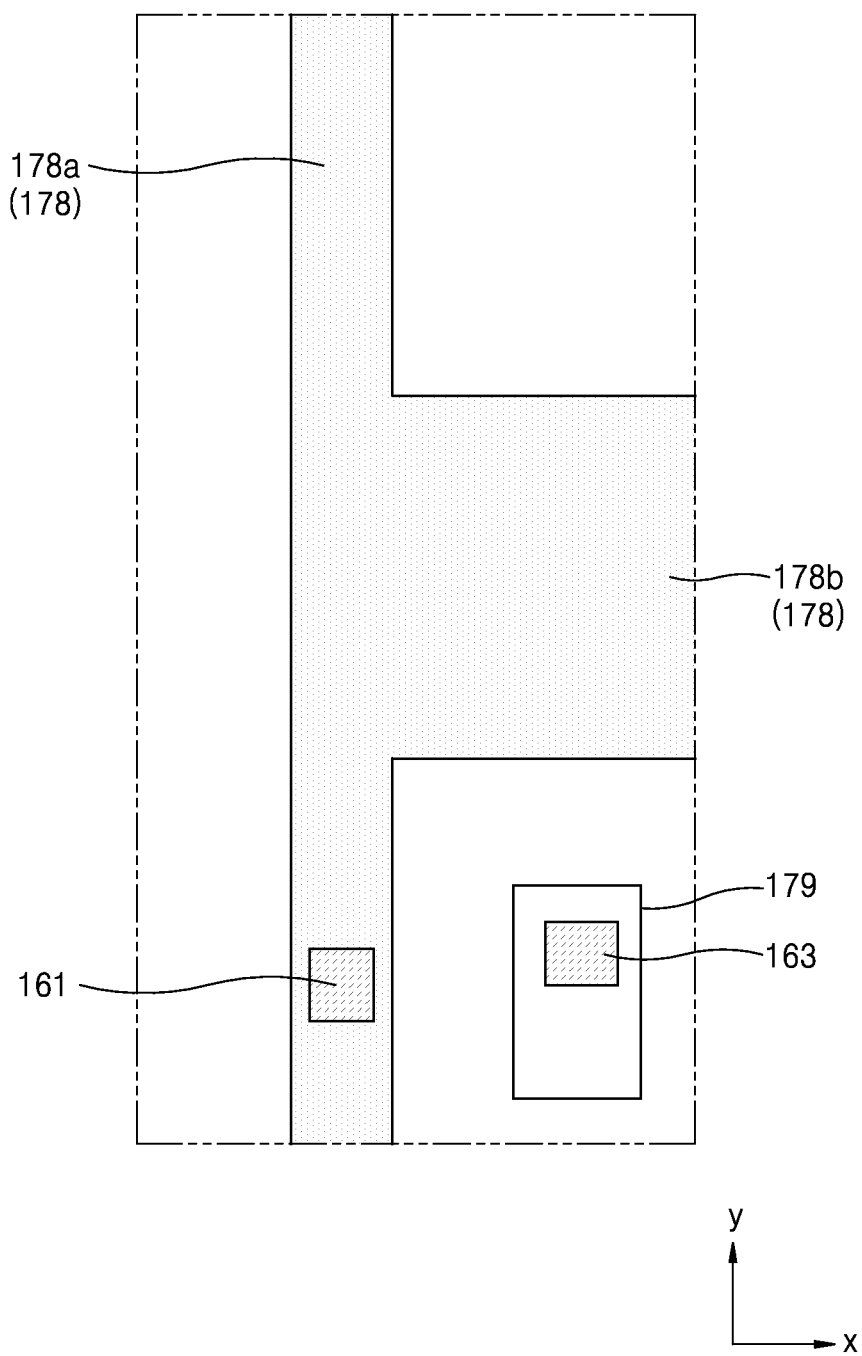
FIG. 8 is a plan view of another layer among the layers in FIG. 3.

Referring to FIGS. 3, 8, and 10, the conductive layer 178 and an auxiliary connection layer 179 are located on the second interlayer insulating layer 160. The conductive layer 178 and the auxiliary connection layer 179 may include the same material. For example, the conductive layer 178 and the auxiliary connection layer 179 may include a conductive material including molybdenum (Mo), aluminum (Al), copper (Cu), titanium (Ti), or the like, and may include a single layer or multiple layers including the conductive material. For example, the conductive layer 178 and the auxiliary connection layer 179 may have a multilayered structure of Ti/Al/Ti.

The conductive layer 178 includes a wiring portion 178a that extends in the column direction (y direction) and an extending portion 178b that extends in the row direction (x direction) from the wiring portion 178a. The extending portion 178b covers the first electrode layer 125a and the compensation TFT T3 while overlapping at least a portion of the first electrode layer 125a and the compensation TFT T3. For example, the extending portion 178b may overlap a portion of the first electrode layer 125a. The extending portion 178b may overlap and cover the compensation channel region 131c1 of the compensation semiconductor layer 130c, at least a portion of the compensation gate electrode 125c1, and the compensation source region 176c. In this case, the compensation channel region 131c3 and the compensation drain region 177c that is connected to the first initialization TFT T4 may not overlap the conductive layer 178.

The conductive layer 178 may be connected to a wiring to which a constant voltage is applied. In an embodiment, the conductive layer 178 may be electrically connected to the driving voltage line 172 under the conductive layer 178 through a contact hole 161 defined in the second interlayer insulating layer 160. In other words, the conductive layer 178 may correspond to an upper driving voltage line, and the driving voltage line 172 may correspond to a lower driving voltage line.

A display apparatus that provides a high-quality image would need to prevent a voltage drop or the like from occurring in the driving voltage line 172. As shown in FIG. 7, the driving voltage line 172 is located in the same layer as the data line 171, the initialization connection line 173, the node connection line 174, the intermediate connection layer 175, and the like, and thus the extent to which the area of the driving voltage line 172 may be expanded in this layer is spatially limited. However, according to the present embodiment, since the conductive layer 178 that is an upper driving voltage line, and the driving voltage line 172 that is a lower driving voltage line are electrically connected to each other, an issue of the voltage drop may be resolved.

In the present embodiment, the conductive layer 178 corresponds to a wiring to which the driving voltage ELVDD is applied. In recent years, as the resolution of a display apparatus increases, more pixels are required to be included in a certain area, so that overlapping components may be unavoidable.

As a comparative example, when the wiring portion 178a that extends in the column direction (y direction) passes under a light-emitting region EM, a color abnormality defect according to a viewing angle may occur due to the asymmetry of the wiring portion 178a located under the light-emitting region EM. In other words, as the wiring portion 178a passes under the light-emitting region EM, the light-emitting region EM is asymmetrically divided by the wiring portion 178a in a plane view, and this asymmetry may result in a color abnormality defect according to a viewing angle.

Referring to FIG. 3, in the present embodiment, the wiring portion 178a is provided not to overlap the light-emitting region EM. Therefore, the present display apparatus may not exhibit the color abnormality defect of the light-emitting region EM that may occur due to the asymmetry of the wiring portion 178a that passes under the light-emitting region EM.

The extending portion 178b of the conductive layer 178 may be interposed between a pixel electrode 210 and the first electrode layer 125a overlapping the pixel electrode 210 and the first electrode layer 125a, and thus prevents or reduces parasitic capacitance Cga between the pixel electrode 210 and the gate electrode G1 of the driving TFT T1.

When the node connection line 174 is connected to the first electrode layer 125a as shown in FIG. 3, parasitic capacitance Cga between the pixel electrode 210 and the node connection line 174 corresponds to the parasitic capacitance Cga between the pixel electrode 210 and the gate electrode G1 of the driving TFT T1. The extending portion 178b overlaps the node connection line 174 while overlapping the pixel electrode 210 and thus may prevent or reduce the parasitic capacitance Cga.

As a comparative example, when the extending portion 178b is not provided, the driving current IDLED may not be constant in a saturation region and may unintentionally increase, due to the parasitic capacitance Cga. To realize a display apparatus that provides a high-quality image, it is ideal that the driving current IDLED has a constant value in the saturation region. However, due to the parasitic capacitance Cga or the like, the driving current IDLED may unintentionally increase in the saturation region in the absence of the extending portion 178b, causing a current deviation. In this case, the OLED may emit light at a luminance that is different from that intended originally.

According to the present embodiment, since the parasitic capacitance Cga is prevented or reduced by the extending portion 178b, an increase in the drive current IDLED in the saturation region is suppressed. Accordingly, the OLED may be prevented from emitting light at a luminance that is different from that intended originally, and color deviation may be reduced, thereby preventing deterioration of the quality of images provided by the display apparatus.

Referring to FIG. 10, the auxiliary connection layer 179 is connected to the intermediate connection layer 175 through a contact hole 163, and a planarization insulating layer 180 is located on the conductive layer 178 and the auxiliary connection layer 179. The planarization insulating layer 180 may include an organic material such as acryl, benzocyclobutene (BCB), polyimide, or hexamethyldisiloxane (HMDSO).

Figure 9:
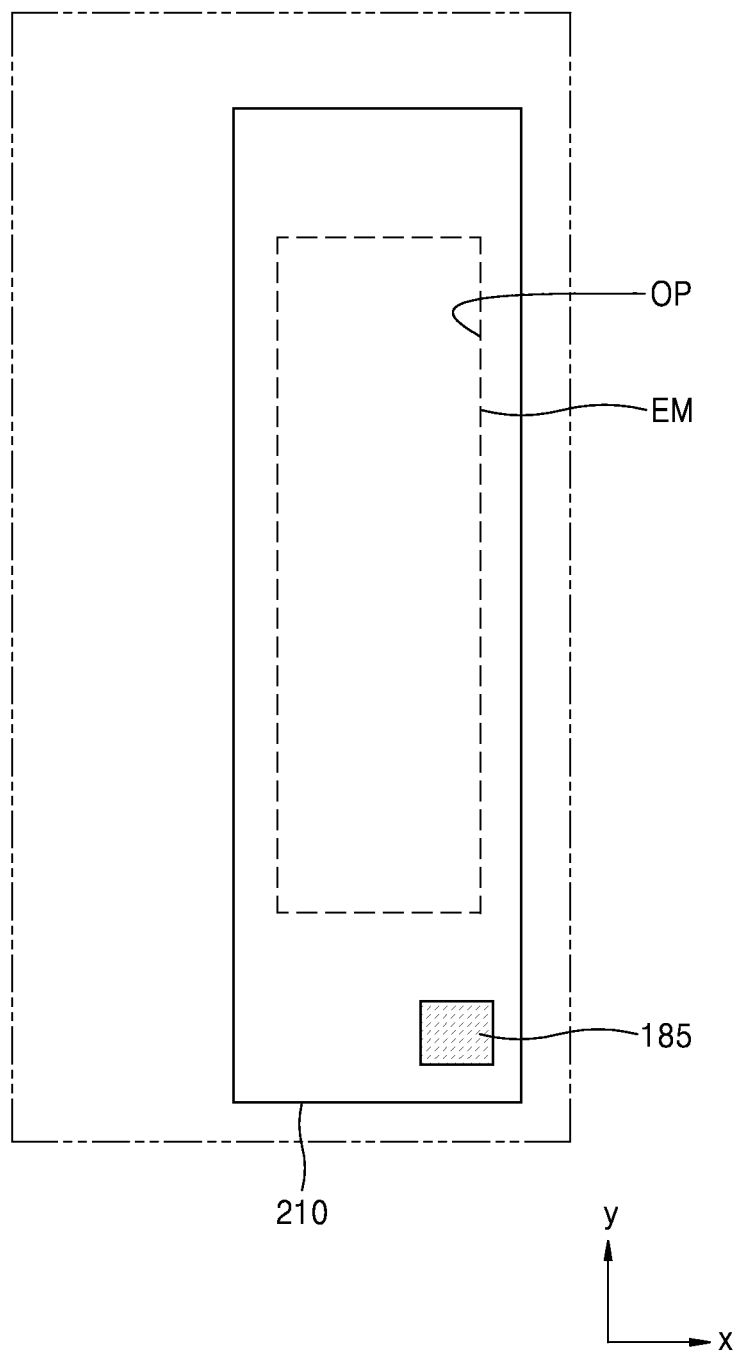
FIG. 9 is a plan view of another layer among the layers in FIG. 3.
Figure 10:
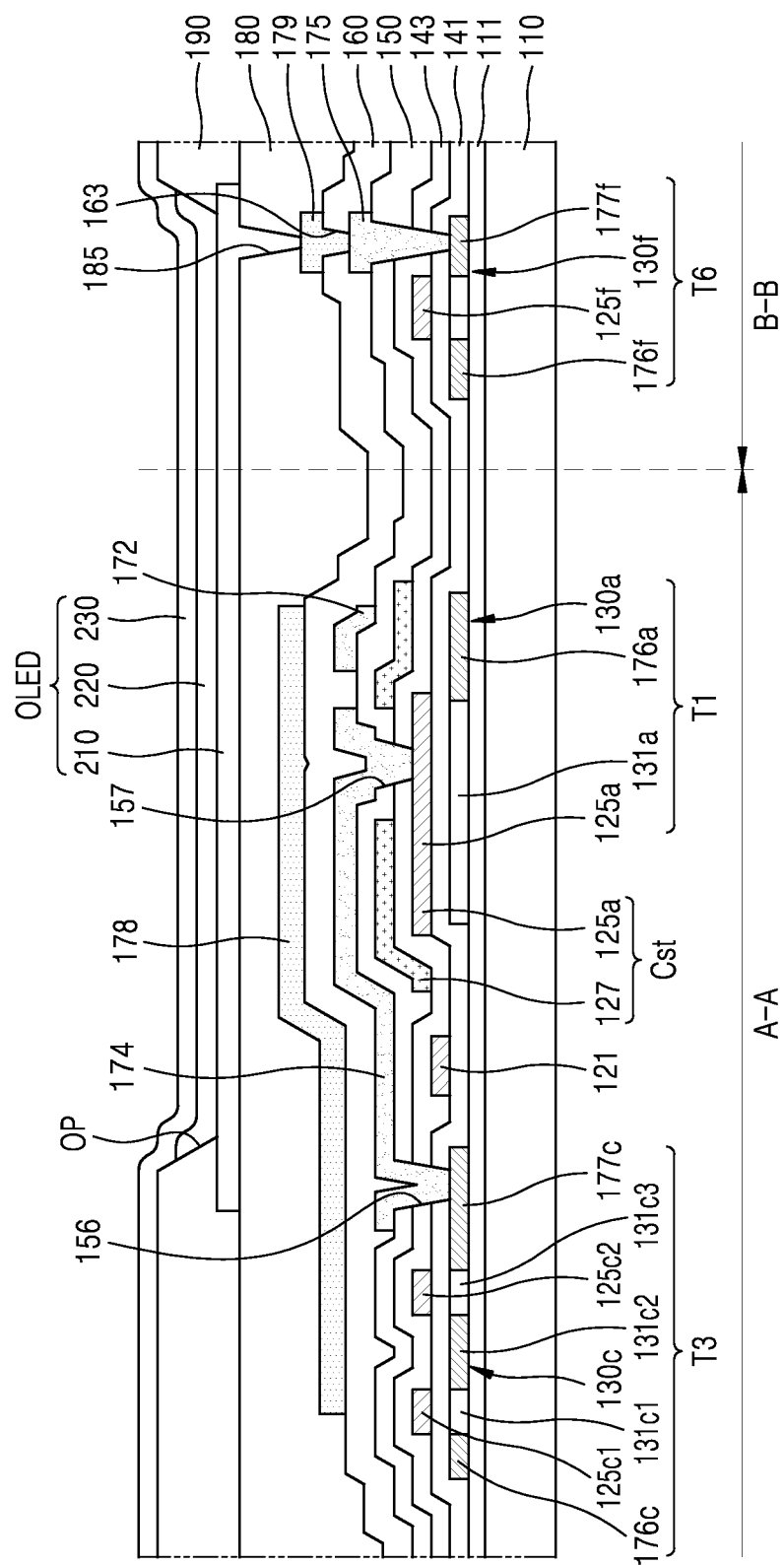
FIG. 10 is a cross-sectional view taken along lines A-A and B-B of FIG. 3.

Referring to FIGS. 3, 9 and 10, the pixel electrode 210 is located on the planarization insulating layer 180. The pixel electrode 210 is connected to the auxiliary connection layer 179 through a contact hole 185 defined in the planarization insulating layer 180. The pixel electrode 210 is connected to the emission control drain region 177f of the emission control TFT T6 by the auxiliary connection layer 179 and the intermediate connection layer 175.

The pixel electrode 210 may be a reflective electrode. For example, the pixel electrode 210 may include a reflective film including Ag, Mg, Al, Pt, Pd, Au, Ni, Nd, Ir, Cr or a compound thereof and a transparent or translucent electrode layer formed on the reflective film. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Referring to FIG. 10, a pixel-defining layer 190 that exposes the pixel electrode 210 is located on the pixel electrode 210. The pixel-defining layer 190 may include at least one organic insulating material selected from the group consisting of polyimide, polyamide, acrylic resin, benzocyclobutene, and phenol resin.

The pixel-defining layer 190 covers the edge of the pixel electrode 210 and has an opening OP for exposing at least a portion of the upper surface of the pixel electrode 210. The light-emitting region EM is defined by the opening OP of the pixel-defining layer 190.

An emission layer 220 is located on the pixel electrode 210 exposed by the opening OP of the pixel-defining layer 190. The emission layer 220 may include an organic material including a fluorescent or phosphorescent material that emits red, green, blue, or white light. The emission layer 220 may include a low molecular organic material or a polymer organic material.

Although not shown in drawings, a functional layer such as a hole transport layer (HTL), a hole injection layer (HIL), an electron transport layer (ETL), or an electron injection layer (EIL) may be selectively arranged.

An opposite electrode 230 may be a light-transmitting electrode. For example, the opposite electrode 230 may be a transparent or translucent electrode and may include a metal thin film having a low work function and including Li, Ca, LiF/Ca, LiF/Al, Al, Ag, Mg, or a compound thereof. In addition, a transparent conductive oxide (TCO) film such as ITO, IZO, ZnO, or $In_2O_3$ may be further located on the metal thin film.

Figure 11:
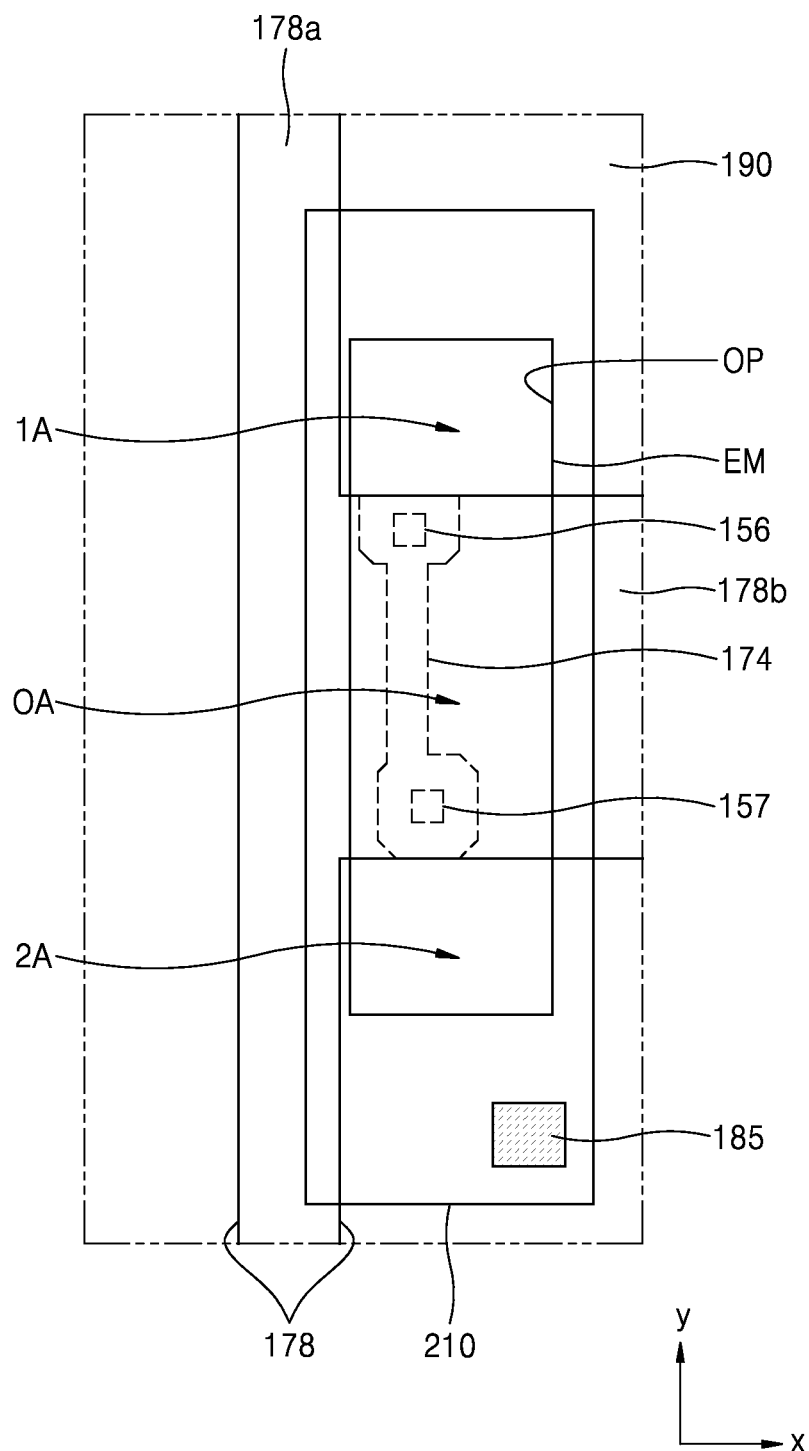
FIG. 11 is a plan view illustrating only some of components of FIGS. 7 to 10.

FIG. 11 is a plan view illustrating only some of the components shown in FIGS. 7 to 10 including the node connection line 174, the conductive layer 178, the pixel electrode 210, and the pixel-defining layer 190.

The pixel-defining layer 190 defines the light-emitting region EM via the opening OP that exposes the upper surface of the pixel electrode 210. The conductive layer 178 is located under the pixel electrode 210. The conductive layer 178 has the wiring portion 178a that extends in the column direction (y direction) and the extending portion 178b that extends from the wiring portion 178a in the row direction (x direction) intersecting the column direction (y direction).

The wiring portion 178a is located not to overlap the light-emitting region EM. As a comparative example, when the wiring portion 178a overlaps the light-emitting region EM and passes under the light-emitting region EM, the light-emitting region EM may be asymmetrically divided by the wiring portion 178a in a plane view, and this asymmetry may result in a color abnormality defect according to a viewing angle. Since the conductive layer 178 is located at the top among the conductive layers located under the pixel electrode 210 as being closest to the pixel electrode 210, the conductive layer 178 has a greater effect on the light emission uniformity of the light-emitting region EM than the other conductive layers.

Therefore, in the present embodiment, the wiring portion 178a is arranged such that it avoids and does not overlap the light-emitting region EM, thereby preventing a color abnormality defect.

The extending portion 178b is located under the pixel electrode 210 and above the node connection line 174 and overlaps the pixel electrode 210 and the node connection line 174. The contact hole 156 at one side of the node connection line 174 is connected to the first electrode layer 125a and the contact hole 157 at the other side of the node connection line 174 is connected to the compensation TFT T3. Therefore, the first electrode layer 125a may be electrically connected to the compensation TFT T3 by the node connection line 174.

In a circuit structure of a conventional display apparatus, a parasitic capacitance Cga may be generated between the pixel electrode 210 and the gate electrode G1 of the driving TFT T1, and a color deviation defect may occur in the light-emitting region EM. As described above, when the node connection line 174 is connected to the first electrode layer 125a, the parasitic capacitance Cga between the pixel electrode 210 and the node connection line 174 may correspond to the parasitic capacitance Cga between the pixel electrode 210 and the gate electrode G1 of the driving TFT T1. The node connection line 174 overlaps the light-emitting region EM, and the parasitic capacitance Cga between the pixel electrode 210 and the node connection line 174 may cause a color deviation defect in the light-emitting region EM.

In the present embodiment, the extending portion 178b overlaps the node connection line 174 while overlapping the pixel electrode 210, the present display apparatus can prevent or reduce the generation of the parasitic capacitance Cga.

In particular, the extending portion 178b may extend in the row direction (x direction) and pass through the light-emitting region EM. In a plane view, the light-emitting region EM may be divided into an overlapping region OA that overlaps the extending portion 178b, a first region 1A located at one side of the overlapping region OA, and a second region 2A located at the other side of the overlapping region OA. In this case, the size of the first region 1A may be equal to that of the second region 2A, and the first region 1A and the second region 2A may be symmetrical to each other with respect to the overlapping region OA.

The extending portion 178b is located under the light-emitting region EM to block or reduce the parasitic capacitance Cga between the pixel electrode 210 and the node connection line 174. In this case, when the extending portion 178b passes the light-emitting region EM while asymmetrically dividing the light-emitting region EM, this asymmetry may cause a color abnormality defect according to a viewing angle of the light-emitting region EM. Therefore, the extending portion 178b is arranged to pass over the geometrical center of the light-emitting region EM in a plane view when the extending portion 178b passes under the light-emitting region EM. In other words, the extending portion 178b is arranged to divide the light-emitting region EM symmetrically in a plane view, so that a color abnormality defect according to the viewing angle of the light-emitting region EM that may be otherwise caused by the asymmetry, can be resolved.

Figure 12:
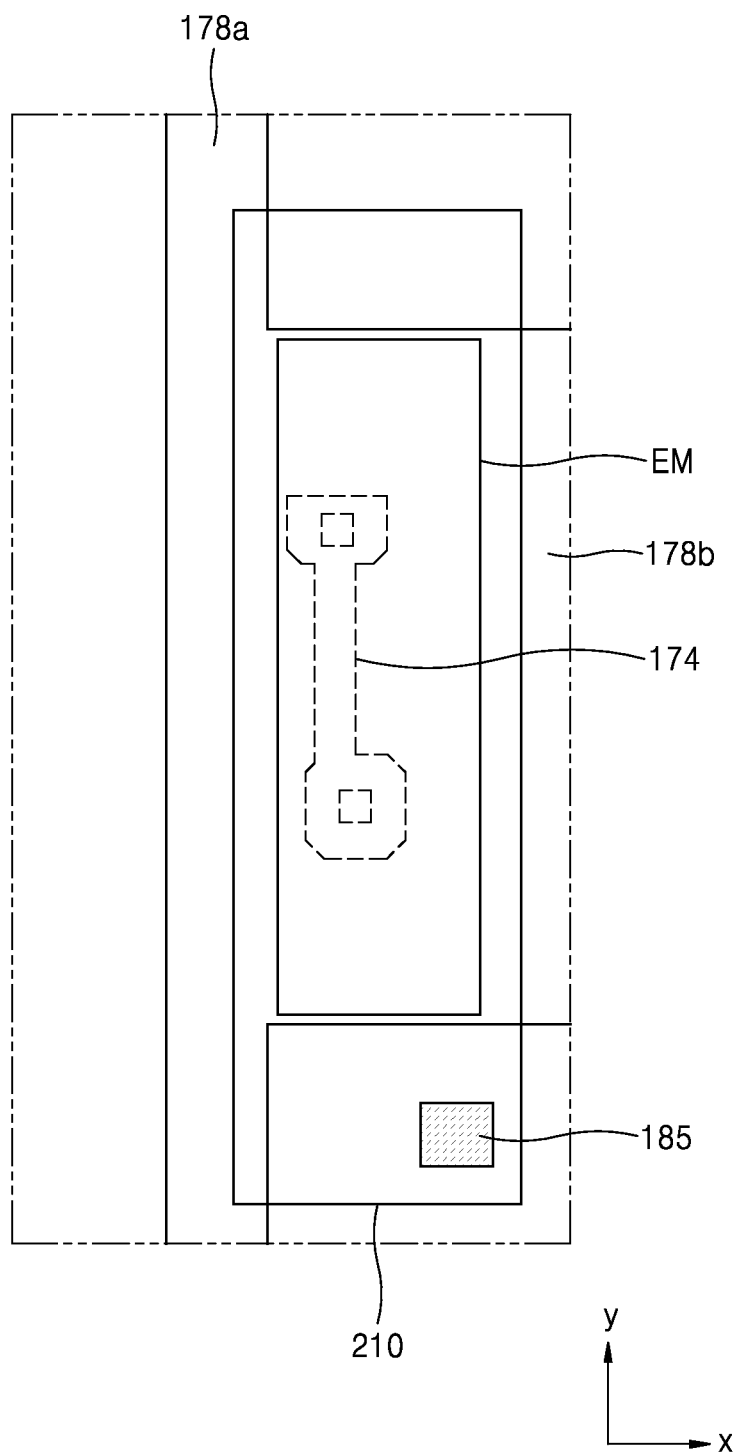
FIGS. 12 and 13 illustrate embodiments modified from the embodiment of FIG. 11.
Figure 13:
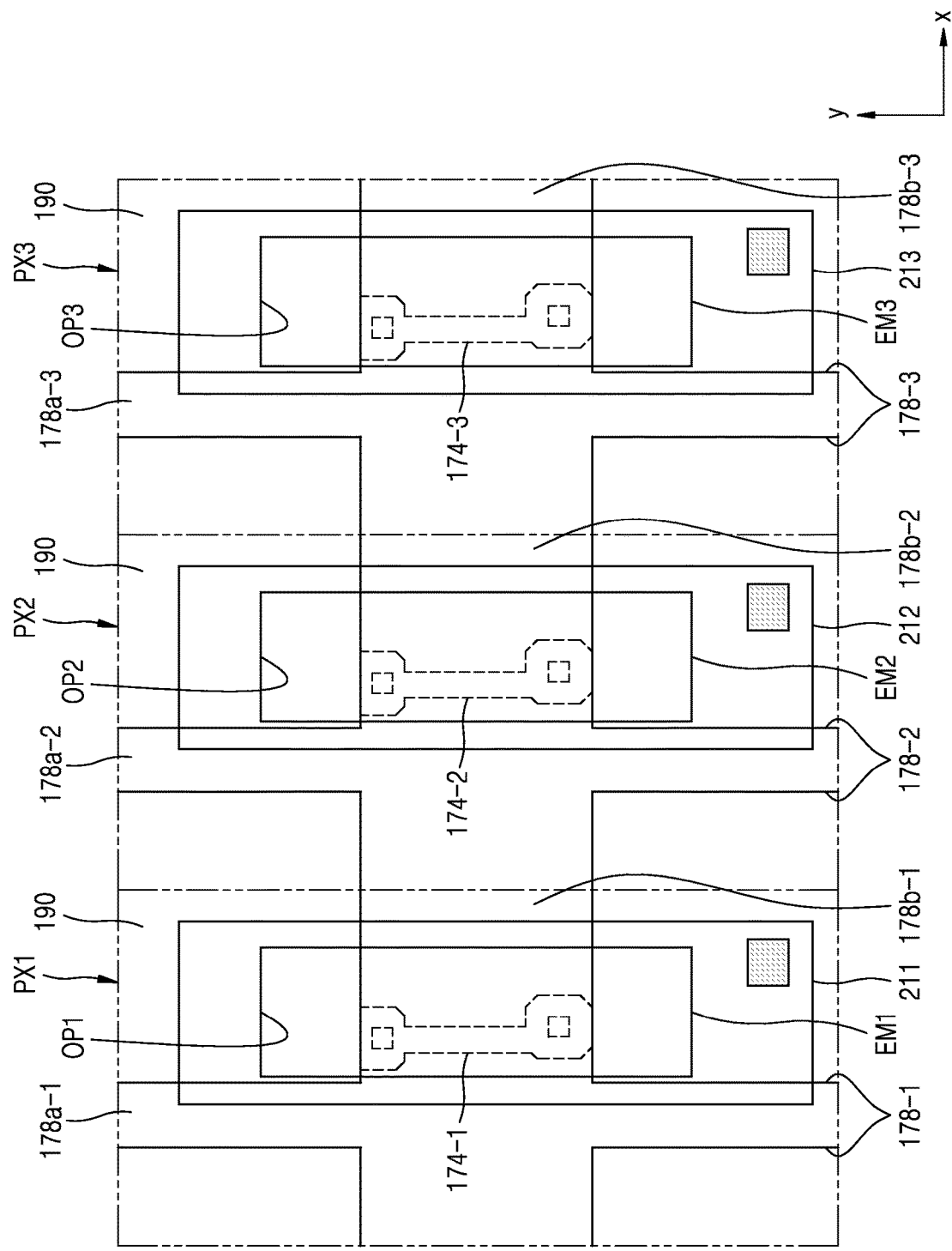

FIGS. 12 and 13 illustrate embodiments modified from the embodiment of FIG. 11. The embodiment of FIG. 12 differs from the embodiment of FIG. 11 in the structure of the extending portion 178b. All other components except the extending portion 178b are substantially the same as those described with respect to the embodiment of FIG. 11.

Referring to FIG. 12, the extending portion 178b extends in the row direction (x direction) from the wiring portion 178a and entirely overlaps the light-emitting region EM. That is, the extending portion 178b overlaps the entire surface of the light-emitting region EM, so that the light-emitting region EM may emit light of the same luminance from the entire surface of the light-emitting region EM regardless of the position of the node connection line 174 that may cause the parasitic capacitance Cga.

As another embodiment, FIG. 13 illustrates a first pixel PX1, a second pixel PX2, and a third pixel PX3. Each of the first to third pixels PX1, PX2, and PX3 is similar to the embodiment of FIG. 10, and FIG. 13 shows a structure in which the extending portion 178b is consecutively arranged in the first to third pixels PX1, PX2, and PX3.

The first pixel PX1 includes a first pixel electrode 211 and a first conductive layer 178-1, the second pixel PX2 includes a second pixel electrode 212 and a second conductive layer 178-2, and the third pixel PX3 includes a third pixel electrode 213 and a third conductive layer 178-3. The pixel-defining layer 190 has a first opening OP1, a second opening OP2, and a third opening OP3 respectively exposing at least a portion of the upper surfaces of the first to third pixel electrodes 211, 212, and 213, and first to third light-emitting regions EM1, EM2, and EM3 in the first to third pixels PX1, PX2, and PX3 are defined by the first to third openings OP1, OP2, and OP3. In an embodiment, the first light-emitting region EM1 of the first pixel PX1 emits light of a red color wavelength, the second light-emitting region EM2 of the second pixel PX2 emits light of a green color wavelength, and the third light-emitting region EM3 of the third pixel PX3 emits light of a green color wavelength.

The first conductive layer 178-1 of the first pixel PX1 includes a first wiring portion 178a-1 and a first extending portion 178b-1, the second conductive layer 178-2 of the second pixel PX2 includes a second wiring portion 178a-2 and a second extending portion 178b-2, and the third conductive layer 178-3 of the third pixel PX3 includes a third wiring portion 178a-3 and a third extending portion 178b-3. The first to third wiring portions 178a-1, 178a-2, and 178a-3 extend in the column direction (y direction) in parallel with each other, and the first to third extending portions 178b-1, 178b-2, and 178b-3 extend in the row direction (x direction).

The first extending portion 178b-1 covers a first node connection line 174-1 under the first pixel electrode 211 and extends in the row direction (x direction) from a portion of the first wiring portion 178a-1 to symmetrically divide the first light-emitting region EM1 in a plane view. Likewise, the second extending portion 178b-2 covers a second node connection line 174-2 under the second pixel electrode 212 and extends in the row direction (x direction) from a portion of the second wiring portion 178a-2 to symmetrically divide the second light-emitting region EM2 in the plane view. Likewise, the third extending portion 178b-3 covers a third node connection line 174-3 under the third pixel electrode 213 and extends in the row direction (x direction) from a portion of the third wiring portion 178a-3 to symmetrically divide the third light-emitting region EM3 in the plane view.

The first extending portion 178b-1 extends to the second pixel PX2 to connect the first wiring portion 178a-1 to the second wiring portion 178a-2. The second extending portion 178b-2 extends to the third pixel PX3 to connect the second wiring portion 178a-2 to the third wiring portion 178a-3. The third extending portion 178b-3 also connects the third wiring portion 178a-3 to a wiring portion (not shown, e.g., the first wiring portion) of a pixel (not shown) that is adjacent to the third pixel PX3.

The first to third extending portions 178b-1, 178b-2, and 178b-3 may be consecutively arranged and integrally formed. In a display apparatus in which a plurality of pixels are arranged in a matrix form, as the first to third wiring portions 178a-1, 178a-2, and 178a-3 are electrically and physically connected to each other by the first to third extending portions 178b-1, 178b-2, and 178b-3, the first to third conductive layers 178-1, 178-2, and 178-3 may have a mesh structure.

Although FIGS. 11 to 13 illustrate examples where the light-emitting region EM is rectangular, the light-emitting region EM may be provided in various shapes in a plane view. For example, the light-emitting region EM may have various shapes such as a polygon, an ellipse, and a polygon with rounded corners.

In addition, although FIGS. 1 to 13 illustrate examples where a plurality of pixels are provided in the form of stripes, the plurality of pixels may be provided in a square form or a PenTile form, and the above descriptions may be equally applicable to pixels of the square form or the PenTile form.

Figure 14:
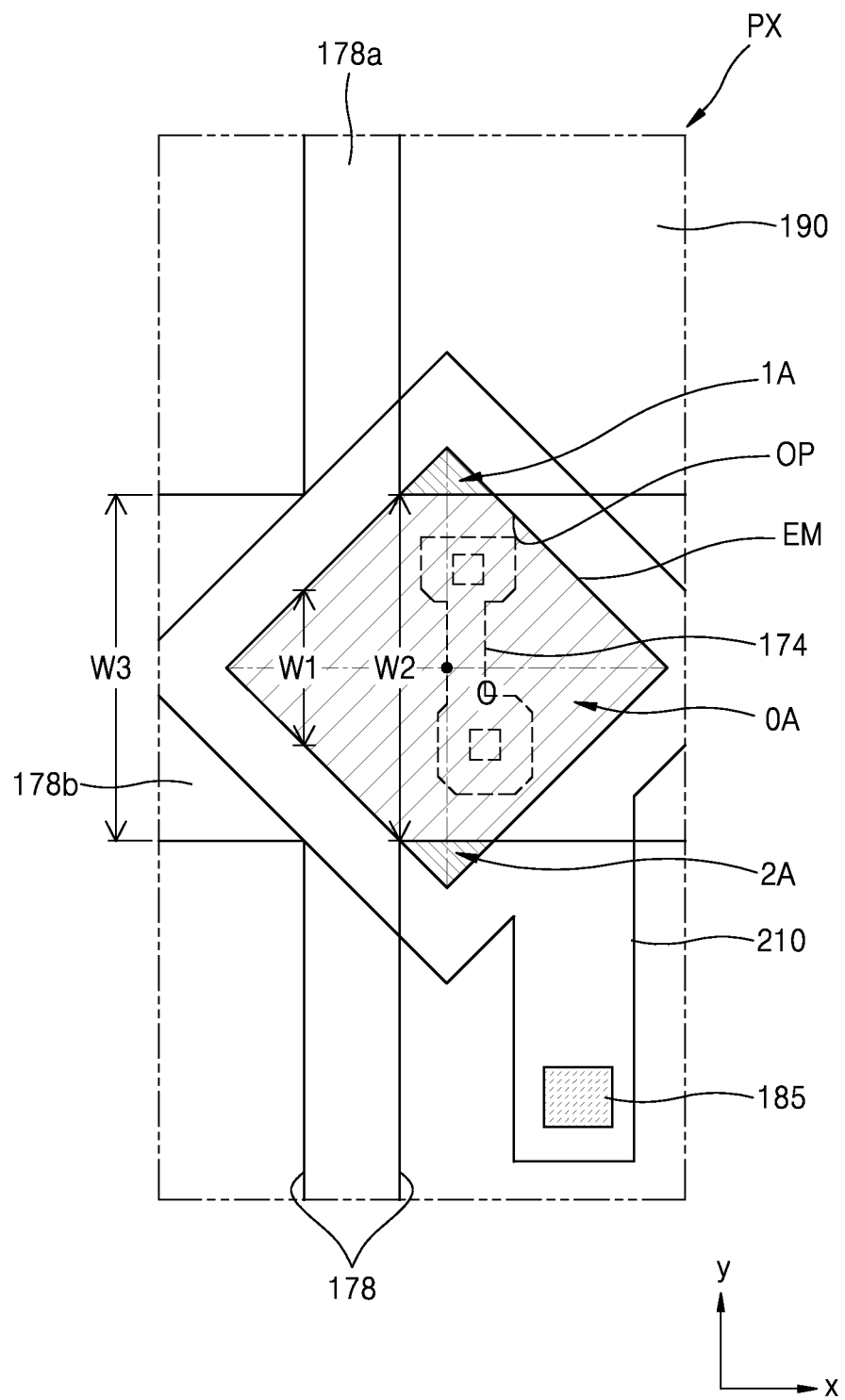
FIGS. 14 to 21 illustrate other embodiments modified from the embodiment of FIG. 11.
Figure 15:
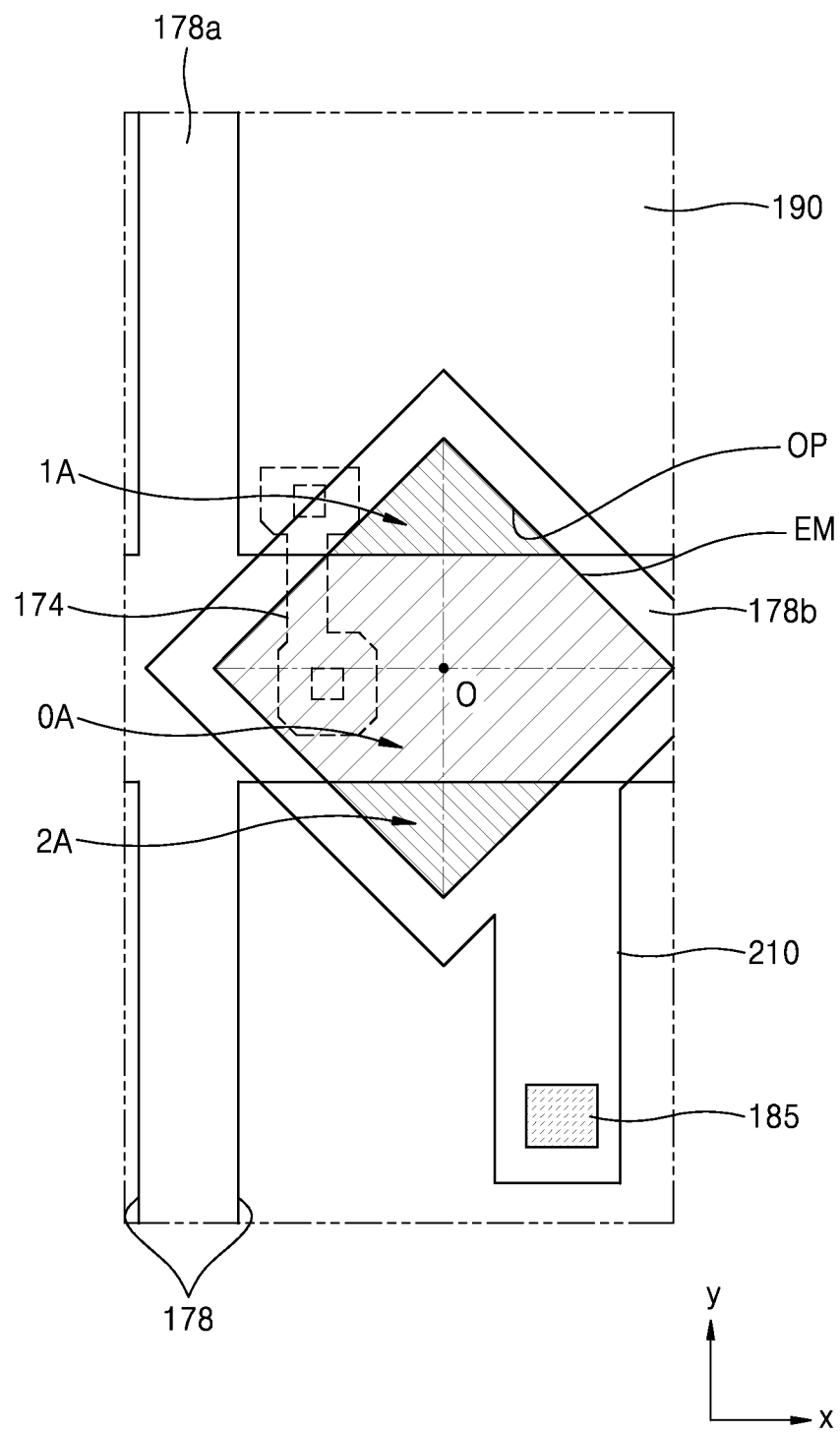
Figure 16:
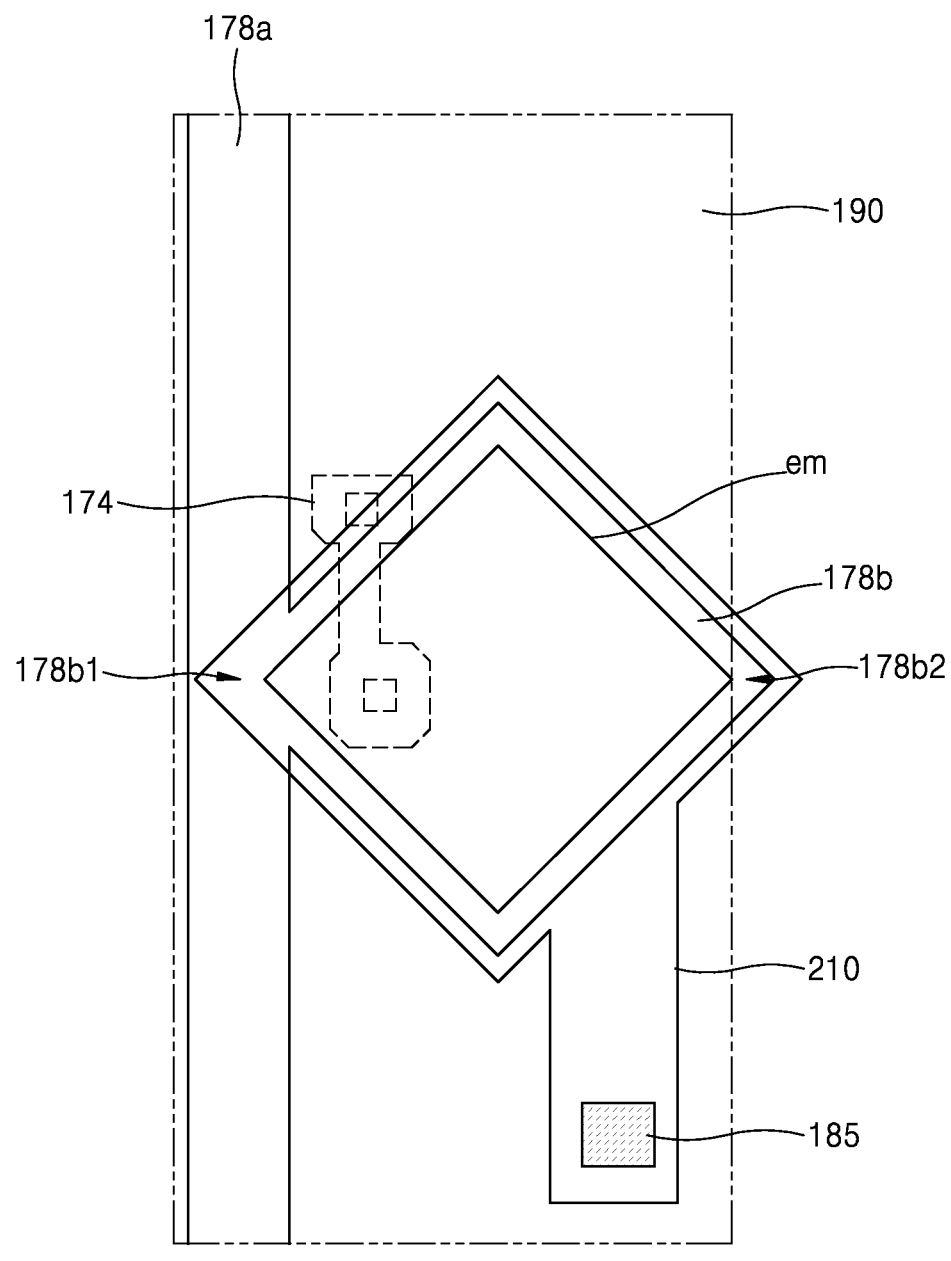

As another embodiment, FIGS. 14 to 16 illustrate examples where a light-emitting region EM is formed in a diamond shape. In FIGS. 14 to 16, only a node connection line 174, a conductive layer 178, a pixel electrode 210, and a pixel-defining layer 190 are shown, and other configurations are substantially the same as those described with respect to the above-described embodiments.

Referring to FIG. 14, a pixel PX includes the node connection line 174, the conductive layer 178 located on the node connection line 174, the pixel electrode 210 located on the conductive layer 178, and the pixel-defining layer 190 located on the pixel electrode 210. The pixel-defining layer 190 defines the light-emitting region EM through an opening OP that exposes at least a portion of an upper surface of the pixel electrode 210. In the present embodiment, the light-emitting region EM may be formed in a diamond shape.

When the light-emitting region EM is formed in the diamond shape, the width in the row direction (x direction) may be greater than that in a pixel having a rectangular shaped-light-emitting region formed in the column direction (y direction), and thus, it may not be easy to design the wiring portion 178a that can avoid the light-emitting region EM.

In the embodiment shown in FIG. 14, the wiring portion 178a overlaps the light-emitting region (EM), and the extending portion 178b is provided by an overlapping width. That is, the wiring portion 178a may overlap the light-emitting region EM with a minimum first width w1 to a maximum second width w2 (in the column direction), and the extending portion 178b may have a width w3 that is equal to the maximum second width w2 of the wiring portion 178a.

In this case, the extending portion 178b passes over the geometrical center O of the light-emitting region EM in a plane view. The geometrical center O of the light-emitting region EM may be defined as a point where lines connecting edges meet when the light-emitting region EM is a polygon in a plane view. The light-emitting region EM may have an overlapping region OA that overlaps the extending portion 178b, and a first region 1A at one side of the overlapping region OA and a second region 1B at the other side of the overlapping region OA may be symmetrical to each other.

In FIG. 14, the node connection line 174 is shown as being entirely covered by the extending portion 178b. However, when a region where the node connection line 174 and the light-emitting region EM overlap each other is not completely covered by the extending portion 178b, the width of the extending portion 178b may increase such that the region where the node connection line 174 and the light-emitting region EM overlap each other is completely covered by the extending portion 178b.

Referring to FIG. 15, a wiring portion 178a is arranged to avoid the light-emitting region EM in a plane view. Therefore, a visibility color deviation problem of the light-emitting region EM may be resolved by the wiring portion 178a. However, in this case, since a portion of the node connection line 174 overlaps the light-emitting region EM, a problem of color deviation of the light-emitting region EM may occur due to the parasitic capacitance Cga that may be generated between the node connection line 174 and the pixel electrode 210.

The extending portion 178b may pass over the geometrical center O of the light-emitting region EM and cover a region where a portion of the node connection line 174 overlaps the light-emitting region EM. In this case, the extending portion 178b that passes under the light-emitting region EM is arranged to divide the light-emitting region EM symmetrically in a plane view. Thus, the extending portion 178b may block the parasitic capacitance Cga that may be generated between the node connection line 174 and the pixel electrode 210, thereby preventing a color deviation defect of the light-emitting region EM.

FIG. 16 is substantially the same as FIG. 15, except that the extending portion 178b is arranged to entirely overlap the light-emitting region EM. As the extending portion 178b overlaps the entire surface of the light-emitting region EM, the parasitic capacitance Cga that may be generated between the node connection line 174 and the pixel electrode 210 may be completely blocked. Although FIG. 16 illustrates an example in which the area of the extending portion 178b is greater than that of the light-emitting region EM, the present disclosure is not limited thereto. The size of the extending portion 178b may be equal to that of the light-emitting region EM as long as the extending portion 178b overlaps the entire surface of the light-emitting region EM.

One side 178b1 of the extending portion 178b may be connected to a wiring portion 178a and the other side 178b2 may extend to the periphery of the pixel PX. Although not shown in FIG. 13, the other side 178b2 of the extending portion 178b may be connected to a wiring portion of another pixel that is adjacent to the pixel PX.

As another embodiment, FIGS. 17 to 21 illustrate examples where a plurality of pixels are provided in a PenTile type. In FIGS. 17 to 20, only node connection lines 174-1 and 174-2, conductive layers 178-1 and 178-2, pixel electrodes 211' and 212', and a pixel-defining layer 190 are shown, and other configurations are substantially the same as those described with respect to the above-described embodiments.

Figure 17:
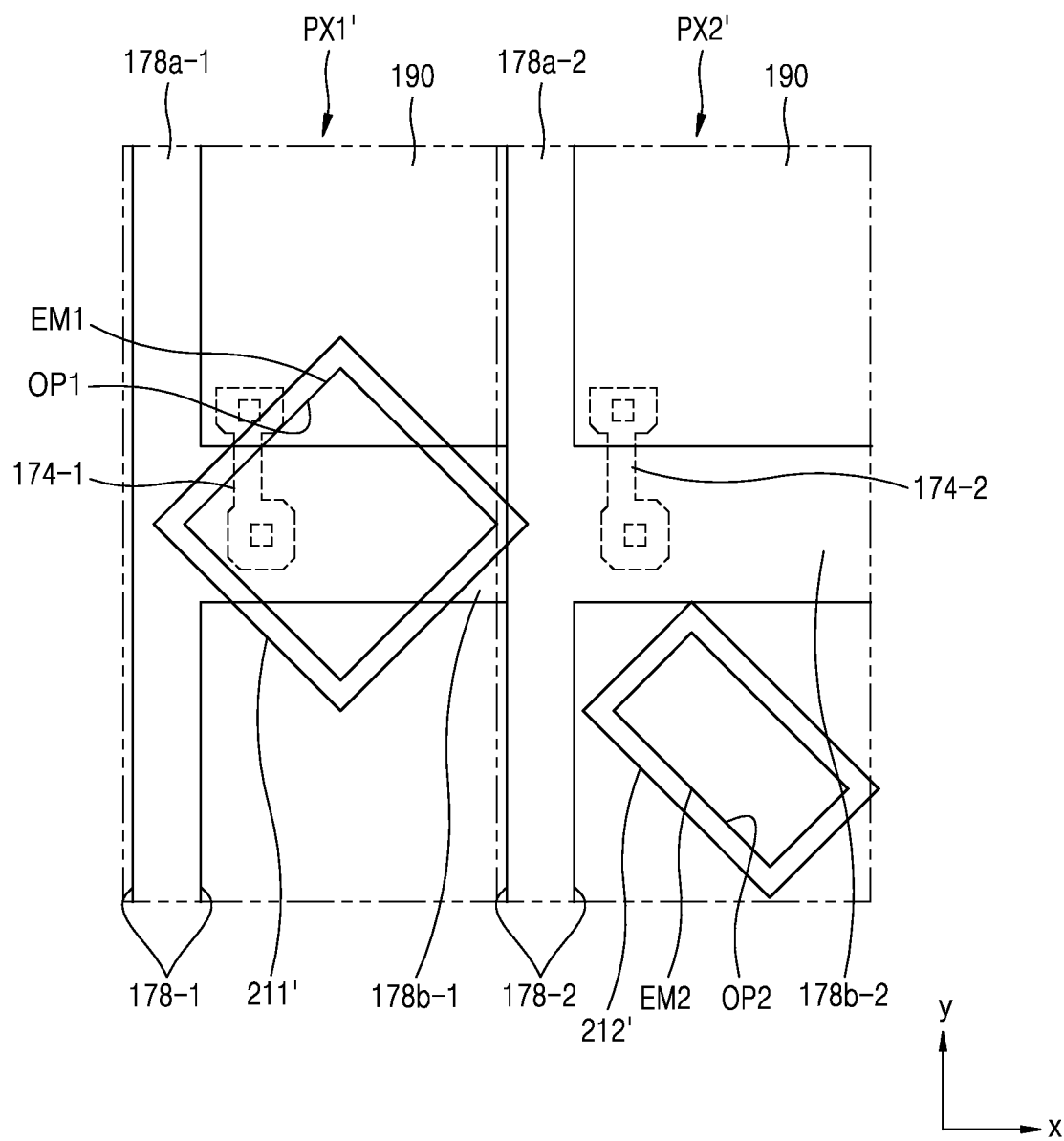
Figure 18:
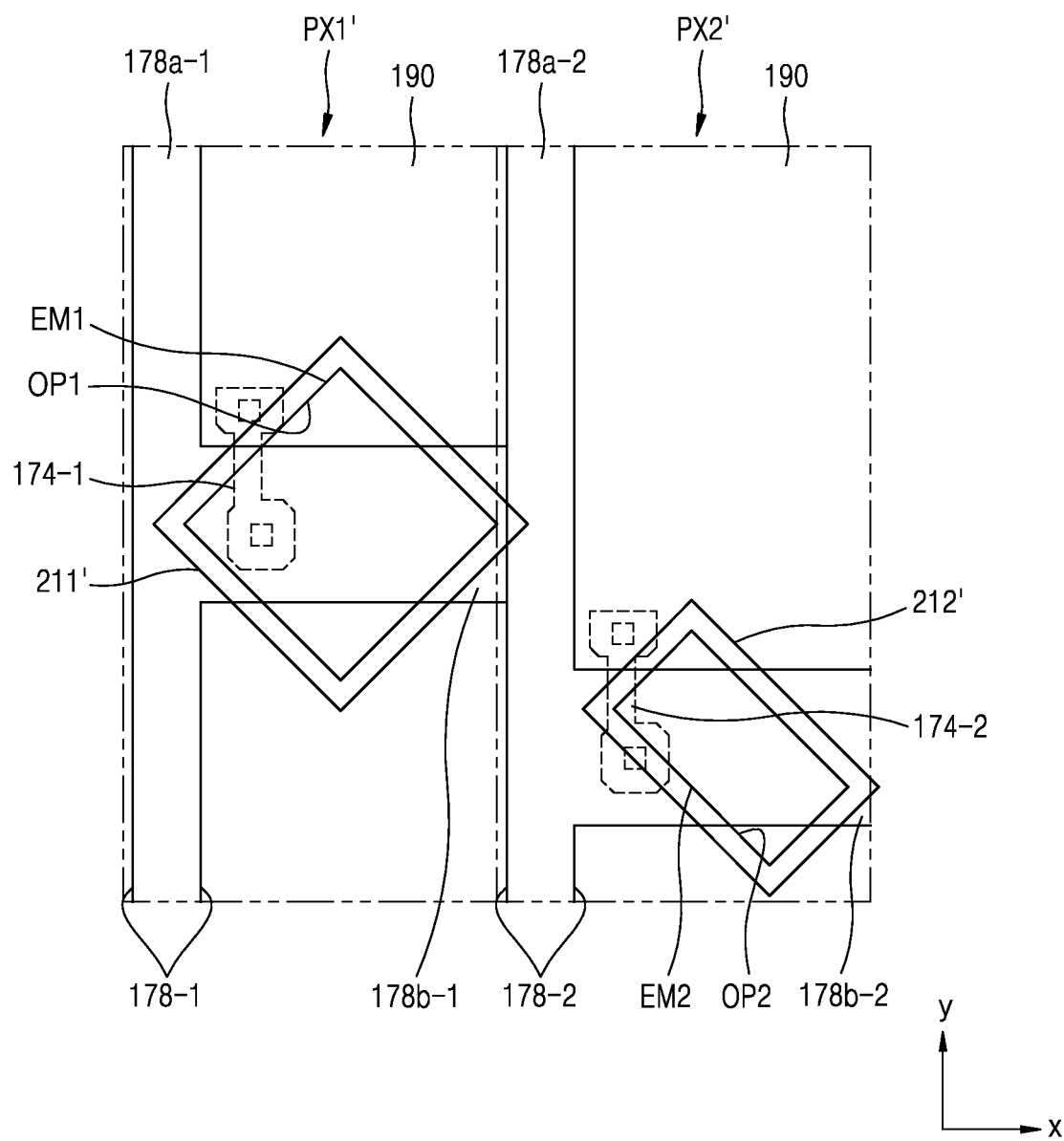
Figure 19:
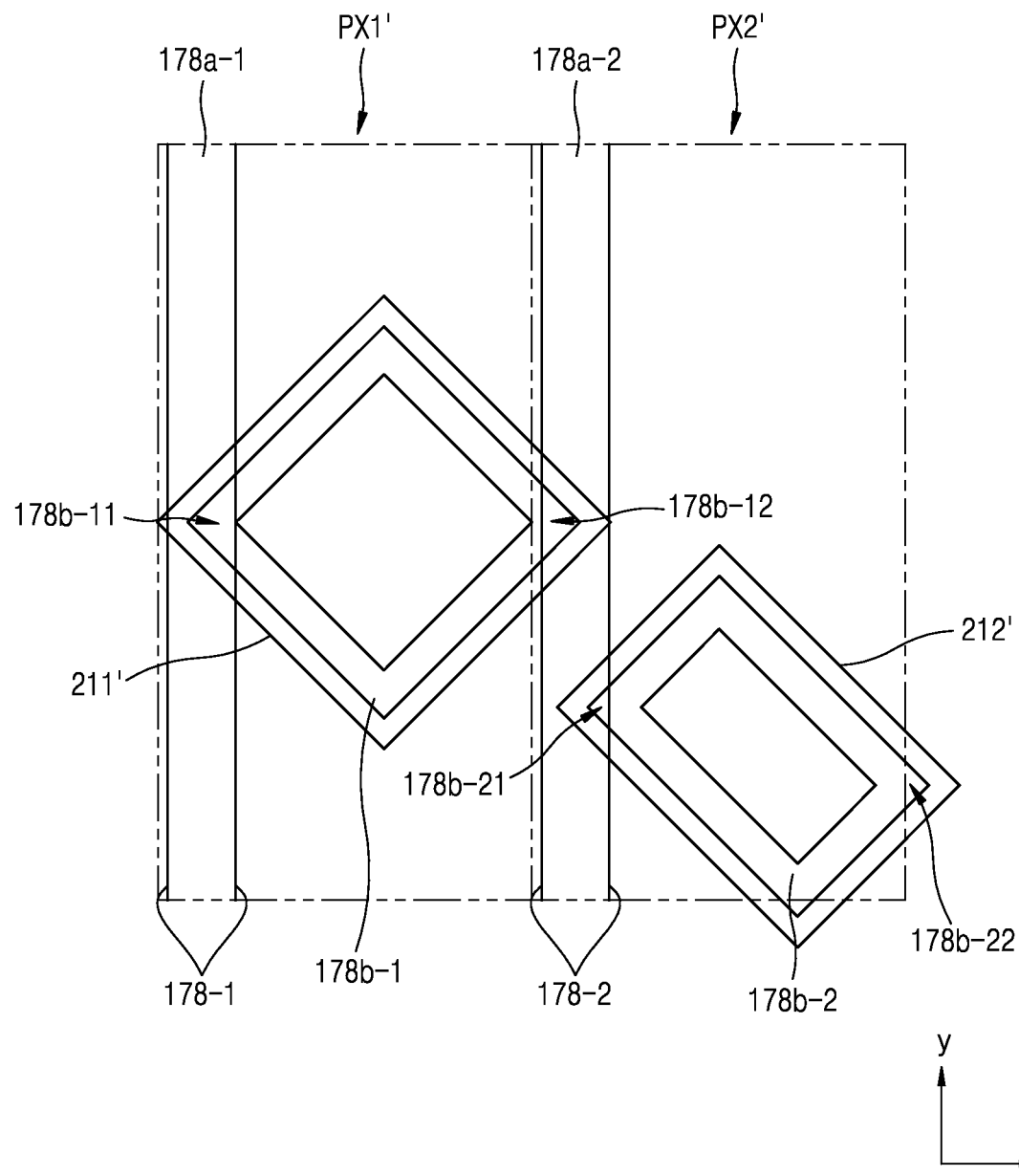
Figure 20:
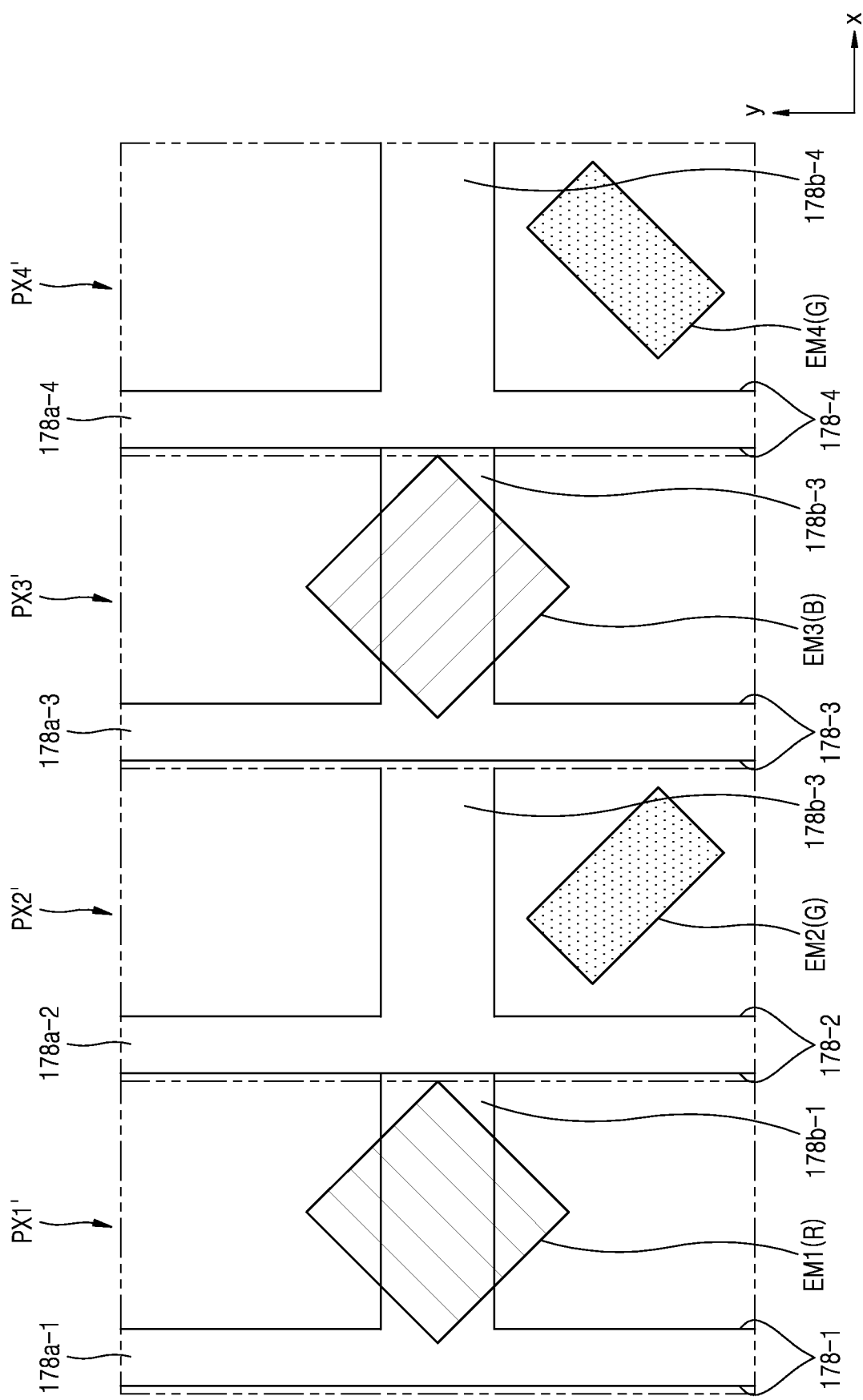
Figure 21:
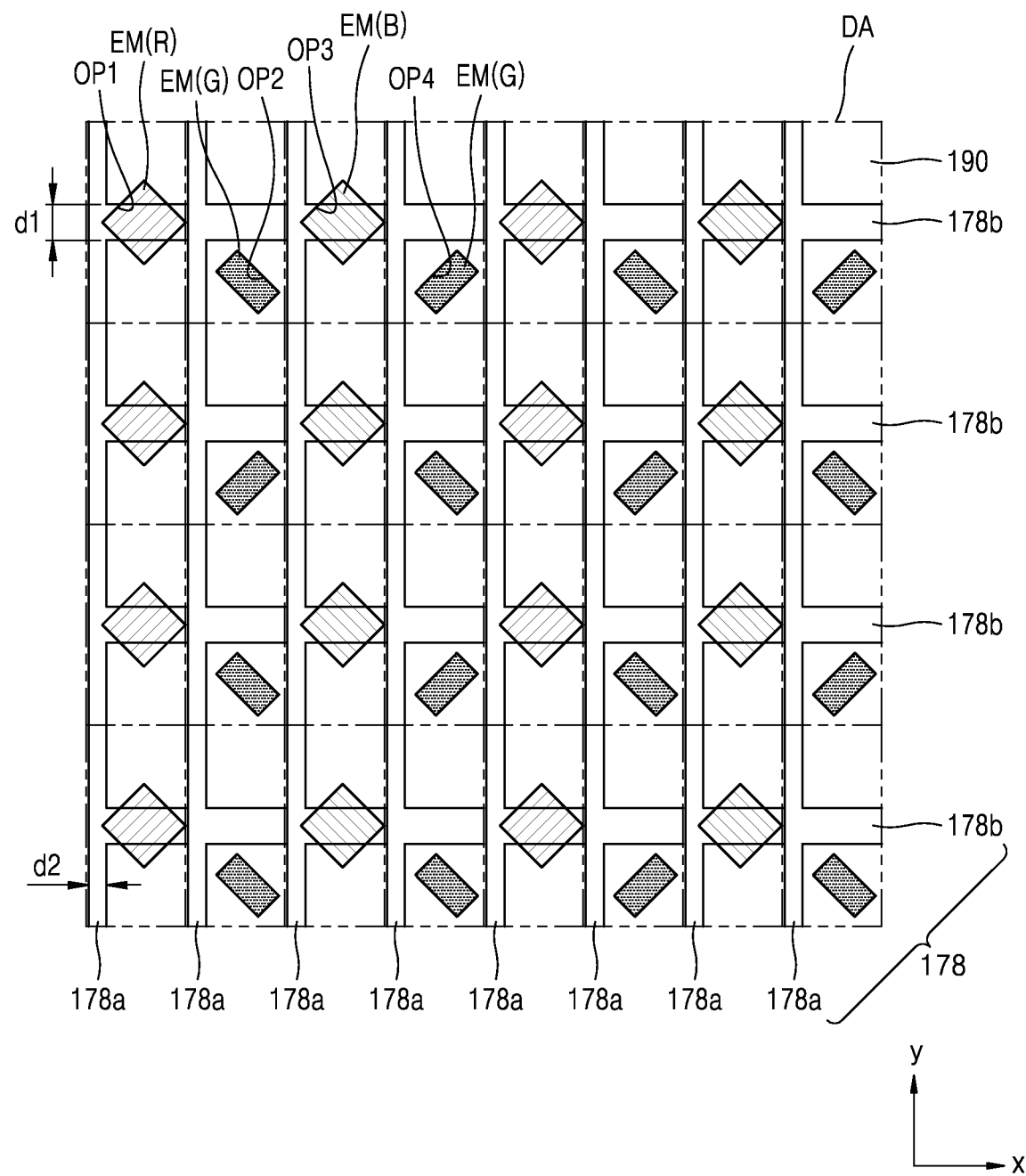

FIGS. 17 to 19 illustrate a first pixel PX1' and a second pixel PX2' that are adjacent to each other. FIG. 20 illustrates a first pixel PX1', a second pixel PX2', a third pixel PX3', and a fourth pixel PX4', and FIG. 21 illustrates a structure in which the structure of FIG. 20 including the first to fourth pixels PX1', PX2', PX3', and PX4' is repeated. In FIGS. 17 to 20, the first to fourth pixels PX1', PX2', PX3', and PX4' may be pixels that emit light of different colors. In FIGS. 17 to 20, the areas of the second and fourth light-emitting regions EM2 and EM4 in the second and fourth pixels PX2' and PX4' are smaller than the areas of the first and third light-emitting regions EM1 and EM3 in the first and third pixels PX1' and PX3'. However, the present disclosure is not limited to shapes or areas of the first to fourth light-emitting regions EM1 to EM4 shown in FIGS. 17 to 20, and the shapes or the areas of the first to fourth light-emitting regions EM1 to EM4 may be freely modified without deviating from the scope of the present disclosure.

In FIGS. 17 to 19, the first pixel PX1' includes a first node connection line 174-1, a first conductive layer 178-1, a first pixel electrode 211', and a pixel-defining layer 190 having a first opening OP1 that are sequentially stacked. The pixel-defining layer 190 defines the first light-emitting region EM1 through the first opening OP1 that exposes at least a portion of an upper surface of the first pixel electrode 211'. In the present embodiment, the first light-emitting region EM1 of the first pixel PX1' may be formed in a diamond shape. The first conductive layer 178-1 includes a first wiring portion 178a-1 and a first extending portion 178b-1 that may be integrally formed. In other words, the first extending portion 178b-1 may be a portion that extends from the first wiring portion 178a-1.

The second pixel PX2' includes a second node connection line 174-2, a second conductive layer 178-2 including a second wiring portion 178a-2 and a second extending portion 178b-2, a second pixel electrode 212', and a pixel-defining layer 190 having a second opening OP2 that are sequentially stacked. The pixel-defining layer 190 defines the second light-emitting region EM2 through the second opening OP2 that exposes at least a portion of an upper surface of the second pixel electrode 212'. In the present embodiment, the second light-emitting region EM2 of the second pixel PX2' may be formed in an obliquely arranged rectangular shape. The second conductive layer 178-2 includes the second wiring portion 178a-2 and the second extending portion 178b-2 that may be integrally formed. In other words, the second extending portion 178b-2 may be a portion that extends from the second wiring portion 178a-2.

Referring to FIG. 17, the first wiring portion 178a-1 and the second wiring portion 178a-2 extend in the column direction (y direction) in parallel with each other. The first extending portion 178b-1 may extend from the first wiring portion 178a-1 in the row direction (x direction) to connect the first wiring portion 178a-1 to the second wiring portion 178a-2. The first wiring portion 178a-1 and the second wiring portion 178a-2 may be electrically connected to each other by the first extending portion 178b-1. Similarly, the second extending portion 178b-2 may extend from the second wiring portion 178a-2 in the row direction (x direction) to connect the second wiring portion 178a-2 to a third wiring portion (not shown) of an adjacent pixel (not shown).

The first extending portion 178b-1 covers a region where the first node connection line 174-1 overlaps the first light-emitting region EM1, and thus blocks parasitic capacitance Cga that may be generated between the first node connection line 174-1 and the first pixel electrode 211'. In this case, the first extending portion 178b-1 may extend in the row direction (x direction) while symmetrically dividing the first light-emitting region EM1 in a plane view.

The first extending portion 178b-1 overlaps the first light-emitting region EM1 to block the parasitic capacitance Cga. However, if the first extending portion 178b-1 extends while asymmetrically dividing the first light-emitting region EM1, there may arise a problem of visibility color deviation in the first light-emitting region EM1 by the first extending portion 178b-1. Thus, the first extending portion 178b-1 overlaps the first light-emitting region EM1 while symmetrically dividing the first light-emitting region EM1 in a plane view, thereby blocking the parasitic capacitance Cga and making light emission luminance by the first pixel PX1' to be uniform. The first wiring portion 178a-1 and the second wiring portion 178a-2 may be electrically connected to each other so that a conductive layer has a mesh structure as a whole.

In the second pixel PX2', the second pixel electrode 212' and the second node connection line 174-2 do not overlap each other and thus the parasitic capacitance Cga may not be generated. In this case, the second extending portion 178b-2 overlaps the second node connection line 174-2 without overlapping the second pixel electrode 212'. The second extending portion 178b-2 may serve to form a mesh structure by electrically connecting the second wiring portion 178a-2 to a third wiring portion (not shown) of an adjacent pixel (not shown).

As another embodiment, FIG. 18 illustrates a structure in which the second node connection line 174-2 and the second pixel electrode 212' overlap each other. In this case, the second extending portion 178b-2 may cover a region where the second node connection line 174-2 overlaps the second pixel electrode 212', similar to the first extending portion 178b-1. That is, in various embodiments, the second extending portion 178b-2 may be arranged to deviate from an extending direction of the first extending portion 178b-1.

Referring to FIG. 19, the first extending portion 178b-1 entirely overlaps the first light-emitting region EM1. In FIG. 19, the size of the first extending portion 178b-1 is greater than that of the first light-emitting region EM1 and smaller than that of the first pixel electrode 211', but the present disclosure is not limited thereto. The first extending portion 178b-1 entirely overlaps the first light-emitting region EM1 and connects the first wiring portion 178a-1 to the second wiring portion 178a-2.

One side 178b-11 of the first extending portion 178b-1 is connected to the first wiring portion 178a-1 and the other side 178b-12 is connected to the second wiring portion 178a-2. The first wiring portion 178a-1 and the second wiring portion 178a-2 may be electrically connected to each other by the first extending portion 178b-1.

Likewise, the second extending portion 178b-2 entirely overlaps the second light-emitting region EM2. One side 178b-21 of the second extending portion 178b-2 is connected to the second wiring portion 178a-2 and the other side 178b-22 is connected to a third wiring portion (not shown) of an adjacent pixel (not shown). The second wiring portion 178a-2 and the third wiring portion (not shown) may be electrically connected to each other by the second extending portion 178b-2.

As shown in FIG. 19, the first extending portion 178b-1 and the second extending portion 178b-1 overlap the first light-emitting region EM1 and the second light-emitting region EM2, respectively, therefore parasitic capacitance Cga that may be generated under the first and second light-emitting regions EM1 and EM2 may be blocked, and a color deviation problem may be resolved.

FIG. 20 illustrates a first pixel PX1', a second pixel PX2', a third pixel PX3', and a fourth pixel PX4' that are arranged adjacent to each other in the row direction (x direction). Each of the first to fourth pixels PX1', PX2', PX3', and PX4' may be a pixel that emits light of different colors. For example, the first to fourth pixels PX1', PX2', PX3', and PX4' may emit one of red light, green light, and blue light. In an embodiment, the first light-emitting region EM1 may emit light of a red (R) wavelength, the second light-emitting region EM2 may emit light of a green (G) wavelength, the third light-emitting region EM3 may emit light of a blue (B) wavelength, and the fourth light-emitting region EM4 may emit light of a green (G) wavelength.

The first to fourth wiring portions 178a-1 to 178a-4 may extend in the column direction (y direction) in parallel with each other, and the first to fourth extending portions 178b-1 to 178b-4 may extend in the row direction (x direction). The first to fourth extending portions 178b-1 to 178b-4 may sequentially connect the first to fourth wiring portions 178a-1 to 178a-4, and thus, the first to fourth conductive layers 178-1 178-4 may be integrally formed.

The first and third extending portions 178b-1 and 178b-3 may extend to overlap the first and third light-emitting regions EM1 and EM3, respectively. In a plane view, the first and third extending portions 178b-1 and 178b-3 may be arranged to symmetrically divide the first and third light-emitting regions EM1 and EM3, respectively. The second extending portion 178b-2 and the fourth extending portion 178b-4 do not overlap the second light-emitting region EM2 and the fourth light-emitting region EM4, respectively. However, the present disclosure is not limited thereto, and the second extending portion 178b-2 and the fourth extending portion 178b-4 may be arranged to overlap the second light-emitting region EM2 and the fourth light-emitting region EM4, respectively.

FIG. 21 illustrates a portion of a display portion DA in which the structure of FIG. 20 is repeatedly arranged.

Referring to FIG. 21, a pixel-defining layer 190 has a first opening OP1, a second opening OP2, a third opening OP3, and a fourth opening OP4 that define light-emitting regions EMs of pixels. The first to fourth openings OP1, OP2, OP3, and OP4 may respectively expose at least a portion of the upper surfaces of first to fourth pixel electrodes (see FIG. 20) located under the pixel-defining layer 190.

Wiring portions 178a extend in the column direction (y direction) with the light-emitting regions EM arranged therebetween, and extending portions 178b connect the wiring portions 178a. The wiring portions 178a have a thickness d2, and the extending portions 178b have a thickness d1. The wiring portions 178a are electrically connected by the extending portions 178b, and a conductive layer 178 has a mesh structure as a whole.

Some of the extending portions 178b may overlap light-emitting regions EM of some of a plurality of pixels, and the rest of the extending portions 178b may not overlap light-emitting regions EM of the rest of the plurality of pixels. FIG. 21 illustrates a PenTile-type pixel arrangement in which pixels are arranged in a zig-zag pattern, and the extending portions 178b may or may not overlap the corresponding light-emitting regions EM. In a pixel in which the extending portion 178b and the light-emitting region EM overlap each other, a node connection line (not shown) is located under a pixel electrode (not shown), and thus parasitic capacitance Cga may be generated between the pixel electrode and the node connection line. The extending portion 178b is arranged to overlap the light-emitting region EM to block the parasitic capacitance Cga. In this case, the extending portion 178b is arranged to symmetrically divide the light-emitting region EM in a plane view, therefore the present display apparatus may not exhibit visibility color deviation due to an asymmetrical arrangement of the conductive layer 178 under the light-emitting region EM.

According to the embodiment as described above, a display apparatus with improved light emission uniformity may be realized.

It should be understood that the embodiments described herein should be considered in a descriptive sense only and not for purposes of limitation. Descriptions of features or aspects within each embodiment should be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A display apparatus comprising:
a substrate including a display area and a peripheral area outside the display area; and a pixel on the substrate to be arranged in the display area, the pixel including a light-emitting region, wherein the pixel comprises:
a pixel electrode;
a first thin film transistor (TFT) electrically connected to the pixel electrode; and a conductive layer between the first TFT and the pixel electrode, the conductive layer including a wiring portion that extends in a first direction and an extending portion that protrudes from the wiring portion and is arranged to pass over a geometrical center of the light-emitting region in a plan view, the extending portion being interposed between the pixel electrode and agate electrode of the first TFT, wherein,
in the plan view, the light-emitting region has an overlapping region that overlaps the extending portion, a first region located at one side of the overlapping region, and a second region located at another side of the overlapping region, wherein an area of the first region is equal to an area of the second region, wherein the first region and the second region are symmetrical to each other with respect to the overlapping region.

2. The display apparatus of claim 1, wherein, in the plan view, an entire area of the extending portion overlaps the light-emitting region.

3. The display apparatus of claim 1, wherein a voltage is applied to the conductive layer.

4. The display apparatus of claim 1, wherein the pixel further comprises:
a lower voltage line under the conductive layer, wherein the lower voltage line supplies a voltage.

5. The display apparatus of claim 4, wherein the pixel further comprises:
an insulating layer between the lower voltage line and the conductive layer, wherein the lower voltage line and the conductive layer are electrically connected to each other through a contact hole defined in the insulating layer.

6. A display apparatus comprising:
a substrate including a display area and a peripheral area outside the display area; and a pixel on the substrate to be arranged in the display area, the pixel including a light-emitting region,
wherein the pixel comprises:
a pixel electrode;

a first thin film transistor (TFT) electrically connected to the pixel electrode; and a conductive layer between the first TFT and the pixel electrode, the conductive layer including a wiring portion that extends in a first direction and an extending portion that protrudes from the wiring portion and is arranged to pass over a geometrical center of the light-emitting region in a plan view, the extending portion being interposed between the pixel electrode and agate electrode of the first TFT, wherein the pixel further comprises:

a first electrode layer at least partially overlapping a first channel region; a second electrode layer on the first electrode layer and overlapping the first electrode layer; a node connection line between the conductive layer and the second electrode layer and having a first side connected to the first electrode layer, in the plan view, wherein the node connection line overlaps the light-emitting region and the extending portion covers a region where the node connection line and the light-emitting region overlap each other.

7. The display apparatus of claim 6, wherein the extending portion entirely covers the node connection line.

8. The display apparatus of claim 6, wherein, in the plan view, the first electrode layer has an island shape.

9. A display apparatus comprising:

a substrate including a display area and a peripheral area outside the display area: and a pixel on the substrate to be arranged in the display area, the pixel including a light-emitting region, wherein the pixel comprises: a pixel electrode; a conductive layer between the substrate and the pixel electrode, the conductive layer including a wiring portion that extends in a first direction and an extending portion that protrudes from the wiring portion and is arranged to pass over a geometrical center of the light-emitting region in a plan view, a first electrode layer at least partially overlapping a first channel region; a second electrode layer on the first electrode layer and overlapping the first electrode layer a node connection line between the conductive layer and the second electrode layer and having a first side connected to the first electrode layer, a first thin film transistor (TFT) including a first semiconductor layer having a first channel region, a first source region, and a first drain region; a second TFT connected to a scan line and a data line; and a third TFT configured to be turned on in response to a scan signal of the scan line and to diode-connect the first TFT, wherein a second side of the node connection line is connected to the third TFT.

10. The display apparatus of claim 9, wherein the pixel further comprises: the third TFT including a third semiconductor layer having a third channel region, a third source region, and a third drain region; and the third TFT including a third gate electrode that overlaps the third channel region, wherein one of the third source region and the third drain region is electrically connected to one of the source region and the drain region.

11. The display apparatus of claim 10, wherein the conductive layer overlaps at least a portion of the third gate electrode.

12. The display apparatus of claim 1, wherein a voltage is applied to the wiring portion, and wherein the wiring portion does not overlap the light-emitting region.

13. The display apparatus of claim 12, wherein the extending portion extends in a second direction intersecting the first direction.

14. The display apparatus of claim 12, wherein the wiring portion and the extending portion are integrally formed.

* * * * *